(12) United States Patent
Li

(10) Patent No.: US 11,461,262 B2
(45) Date of Patent: Oct. 4, 2022

(54) METHOD AND SYSTEM FOR FACILITATING A CONVERGED COMPUTATION AND STORAGE NODE IN A DISTRIBUTED STORAGE SYSTEM

(71) Applicant: Alibaba Group Holding Limited, Grand Cayman (KY)

(72) Inventor: Shu Li, Bothell, WA (US)

(73) Assignee: Alibaba Group Holding Limited, George Town (KY)

( * ) Notice: Subject to any disclaimer, the term of this patent is extended or adjusted under 35 U.S.C. 154(b) by 0 days.

(21) Appl. No.: 15/931,086

(22) Filed: May 13, 2020

(65) Prior Publication Data

US 2021/0357346 A1 Nov. 18, 2021

(51) Int. Cl.
| | |
|---|---|
| *G06F 13/40* | (2006.01) |
| *H05K 7/20* | (2006.01) |
| *G06F 1/28* | (2006.01) |
| *G06F 13/16* | (2006.01) |
| *G06F 11/20* | (2006.01) |

(52) U.S. Cl.
CPC ............ *G06F 13/4027* (2013.01); *G06F 1/28* (2013.01); *G06F 13/1668* (2013.01);
(Continued)

(58) Field of Classification Search
CPC .... G06F 13/4027; G06F 13/1668; G06F 1/28; G06F 11/2094; H05K 7/20236; H05K 7/20645
See application file for complete search history.

(56) References Cited

U.S. PATENT DOCUMENTS

| | | |
|---|---|---|
| 3,893,071 A | 7/1975 | Bossen |
| 4,562,494 A | 12/1985 | Bond |
| (Continued) | | |

FOREIGN PATENT DOCUMENTS

| | | |
|---|---|---|
| JP | 2003022209 | 1/2003 |
| JP | 2011175422 | 9/2011 |
| (Continued) | | |

OTHER PUBLICATIONS https://web.archive.org/web/20071130235034/http://en.wikipedia.org:80/wiki/logical_block_addressing wikipedia screen shot retriefed on wayback Nov. 20, 2007 showing both physical and logical addressing used historically to access data on storage devices (Year: 2007).

(Continued)

*Primary Examiner* — Nimesh G Patel
(74) *Attorney, Agent, or Firm* — Shun Yao; Yao Legal Services, Inc.

(57) ABSTRACT

A printed circuit board comprises: a network controller; a memory controller; a heterogeneous processor; a field-programmable gate array (FPGA); and a non-volatile-media controller. The memory controller comprises: a fabric controller component configured to communicate with the network controller, the heterogeneous processor, the FPGA, and the non-volatile-media controller; and a media controller component configured to manage access relating to data stored in a volatile memory media. The FPGA is configured to perform computations relating to data stored via the non-volatile-media controller. The heterogeneous processor is configured to perform computation tasks relating to data stored via the memory controller. The printed circuit board is configured to be plugged in to a rack with a plurality of other plugged-in circuit boards.

20 Claims, 10 Drawing Sheets

(52) U.S. Cl.
CPC ..... *H05K 7/20236* (2013.01); *H05K 7/20645* (2013.01); *G06F 11/2094* (2013.01)

(56) References Cited

U.S. PATENT DOCUMENTS

| | | | |
|---|---|---|---|
| 4,718,067 A | 1/1988 | Peters | |
| 4,775,932 A | 10/1988 | Oxley | |
| 4,858,040 A | 8/1989 | Hazebrouck | |
| 5,394,382 A | 2/1995 | Hu | |
| 5,602,693 A | 2/1997 | Brunnett | |
| 5,715,471 A | 2/1998 | Otsuka | |
| 5,732,093 A | 3/1998 | Huang | |
| 5,802,551 A | 9/1998 | Komatsu | |
| 5,930,167 A | 7/1999 | Lee | |
| 6,098,185 A | 8/2000 | Wilson | |
| 6,148,377 A | 11/2000 | Carter | |
| 6,226,650 B1 | 5/2001 | Mahajan et al. | |
| 6,243,795 B1 | 6/2001 | Yang | |
| 6,457,104 B1 | 9/2002 | Tremaine | |
| 6,658,478 B1 | 12/2003 | Singhal | |
| 6,795,894 B1 | 9/2004 | Neufeld | |
| 7,351,072 B2 | 4/2008 | Muff | |
| 7,565,454 B2 | 7/2009 | Zuberi | |
| 7,599,139 B1 | 10/2009 | Bombet | |
| 7,953,899 B1 | 5/2011 | Hooper | |
| 7,958,433 B1 | 6/2011 | Yoon | |
| 8,085,569 B2 | 12/2011 | Kim | |
| 8,144,512 B2 | 3/2012 | Huang | |
| 8,166,233 B2 | 4/2012 | Schibilla | |
| 8,260,924 B2 | 9/2012 | Koretz | |
| 8,281,061 B2 | 10/2012 | Radke | |
| 8,452,819 B1 | 5/2013 | Sorenson, III | |
| 8,516,284 B2 | 8/2013 | Chan | |
| 8,527,544 B1 | 9/2013 | Colgrove | |
| 8,751,763 B1 | 6/2014 | Ramarao | |
| 8,819,367 B1 | 8/2014 | Fallone | |
| 8,825,937 B2 | 9/2014 | Atkisson | |
| 8,832,688 B2 | 9/2014 | Tang | |
| 8,868,825 B1 | 10/2014 | Hayes | |
| 8,904,061 B1 | 12/2014 | O'Brien, III | |
| 8,949,208 B1 | 2/2015 | Xu | |
| 9,015,561 B1 | 4/2015 | Hu | |
| 9,031,296 B2 | 5/2015 | Kaempfer | |
| 9,043,545 B2 | 5/2015 | Kimmel | |
| 9,088,300 B1 | 7/2015 | Chen | |
| 9,092,223 B1 | 7/2015 | Pani | |
| 9,129,628 B1 | 9/2015 | Fallone | |
| 9,141,176 B1 | 9/2015 | Chen | |
| 9,208,817 B1 | 12/2015 | Li | |
| 9,213,627 B2 | 12/2015 | Van Acht | |
| 9,280,472 B1 | 3/2016 | Dang | |
| 9,280,487 B2 | 3/2016 | Candelaria | |
| 9,311,939 B1 | 4/2016 | Malina | |
| 9,336,340 B1 | 5/2016 | Dong | |
| 9,436,595 B1 | 9/2016 | Benitez | |
| 9,495,263 B2 | 11/2016 | Pang | |
| 9,529,601 B1 | 12/2016 | Dharmadhikari | |
| 9,529,670 B2 | 12/2016 | O'Connor | |
| 9,575,982 B1 | 2/2017 | Sankara Subramanian | |
| 9,588,698 B1 | 3/2017 | Karamcheti | |
| 9,588,977 B1 | 3/2017 | Wang | |
| 9,607,631 B2 | 3/2017 | Rausch | |
| 9,671,971 B2 | 6/2017 | Trika | |
| 9,747,202 B1 | 8/2017 | Shaharabany | |
| 9,852,076 B1 | 12/2017 | Garg | |
| 9,875,053 B2 | 1/2018 | Frid | |
| 9,910,705 B1* | 3/2018 | Mak | G06F 9/50 |
| 9,912,530 B2 | 3/2018 | Singatwaria | |
| 9,946,596 B2 | 4/2018 | Hashimoto | |
| 10,013,169 B2 | 7/2018 | Fisher | |
| 10,199,066 B1 | 2/2019 | Feldman | |
| 10,229,735 B1 | 3/2019 | Natarajan | |
| 10,235,198 B2 | 3/2019 | Qiu | |
| 10,268,390 B2 | 4/2019 | Warfield | |
| 10,318,467 B2 | 6/2019 | Barzik | |
| 10,361,722 B2 | 7/2019 | Lee | |
| 10,437,670 B1 | 10/2019 | Koltsidas | |
| 10,459,663 B2 | 10/2019 | Agombar | |
| 10,642,522 B2 | 5/2020 | Li | |
| 10,649,657 B2 | 5/2020 | Zaidman | |
| 10,678,432 B1 | 6/2020 | Dreier | |
| 10,756,816 B1 | 8/2020 | Dreier | |
| 10,928,847 B2 | 2/2021 | Suresh | |
| 2001/0032324 A1 | 10/2001 | Slaughter | |
| 2002/0010783 A1 | 1/2002 | Primak | |
| 2002/0039260 A1 | 4/2002 | Kilmer | |
| 2002/0073358 A1 | 6/2002 | Atkinson | |
| 2002/0095403 A1 | 7/2002 | Chandrasekaran | |
| 2002/0112085 A1 | 8/2002 | Berg | |
| 2002/0161890 A1 | 10/2002 | Chen | |
| 2003/0074319 A1 | 4/2003 | Jaquette | |
| 2003/0145274 A1 | 7/2003 | Hwang | |
| 2003/0163594 A1 | 8/2003 | Aasheim | |
| 2003/0163633 A1 | 8/2003 | Aasheim | |
| 2003/0217080 A1 | 11/2003 | White | |
| 2004/0010545 A1 | 1/2004 | Pandya | |
| 2004/0066741 A1 | 4/2004 | Dinker | |
| 2004/0103238 A1 | 5/2004 | Avraham | |
| 2004/0143718 A1 | 7/2004 | Chen | |
| 2004/0255171 A1 | 12/2004 | Zimmer | |
| 2004/0267752 A1 | 12/2004 | Wong | |
| 2004/0268278 A1 | 12/2004 | Hoberman | |
| 2005/0038954 A1 | 2/2005 | Saliba | |
| 2005/0097126 A1 | 5/2005 | Cabrera | |
| 2005/0138325 A1 | 6/2005 | Hofstee | |
| 2005/0144358 A1 | 6/2005 | Conley | |
| 2005/0149827 A1 | 7/2005 | Lambert | |
| 2005/0174670 A1 | 8/2005 | Dunn | |
| 2005/0177672 A1 | 8/2005 | Rao | |
| 2005/0177755 A1 | 8/2005 | Fung | |
| 2005/0195635 A1 | 9/2005 | Conley | |
| 2005/0235067 A1 | 10/2005 | Creta | |
| 2005/0235171 A1 | 10/2005 | Igari | |
| 2006/0031709 A1 | 2/2006 | Hiraiwa | |
| 2006/0101197 A1 | 5/2006 | Georgis | |
| 2006/0156012 A1 | 7/2006 | Beeson | |
| 2006/0184813 A1 | 8/2006 | Bui | |
| 2007/0033323 A1 | 2/2007 | Gorobets | |
| 2007/0061502 A1 | 3/2007 | Lasser | |
| 2007/0101096 A1 | 5/2007 | Gorobets | |
| 2007/0250756 A1 | 10/2007 | Gower | |
| 2007/0266011 A1 | 11/2007 | Rohrs | |
| 2007/0283081 A1 | 12/2007 | Lasser | |
| 2007/0283104 A1 | 12/2007 | Wellwood | |
| 2007/0285980 A1 | 12/2007 | Shimizu | |
| 2008/0034154 A1 | 2/2008 | Lee | |
| 2008/0065805 A1 | 3/2008 | Wu | |
| 2008/0082731 A1 | 4/2008 | Karamcheti | |
| 2008/0104369 A1* | 5/2008 | Reed | G06F 15/17356 712/28 |
| 2008/0112238 A1 | 5/2008 | Kim | |
| 2008/0163033 A1 | 7/2008 | Yim | |
| 2008/0301532 A1 | 12/2008 | Uchikawa | |
| 2009/0006667 A1 | 1/2009 | Lin | |
| 2009/0089544 A1 | 4/2009 | Liu | |
| 2009/0113219 A1 | 4/2009 | Aharonov | |
| 2009/0125788 A1 | 5/2009 | Wheeler | |
| 2009/0183052 A1 | 7/2009 | Kanno | |
| 2009/0254705 A1 | 10/2009 | Abali | |
| 2009/0282275 A1 | 11/2009 | Yermalayeu | |
| 2009/0287956 A1 | 11/2009 | Flynn | |
| 2009/0307249 A1 | 12/2009 | Koifman | |
| 2009/0307426 A1 | 12/2009 | Galloway | |
| 2009/0310412 A1 | 12/2009 | Jang | |
| 2010/0031000 A1 | 2/2010 | Flynn | |
| 2010/0169470 A1 | 7/2010 | Takashige | |
| 2010/0217952 A1 | 8/2010 | Iyer | |
| 2010/0229224 A1 | 9/2010 | Etchegoyen | |
| 2010/0241848 A1 | 9/2010 | Smith | |
| 2010/0321999 A1 | 12/2010 | Yoo | |
| 2010/0325367 A1 | 12/2010 | Kornegay | |
| 2010/0332922 A1 | 12/2010 | Chang | |
| 2011/0031546 A1 | 2/2011 | Uenaka | |
| 2011/0055458 A1 | 3/2011 | Kuehne | |

(56) References Cited

U.S. PATENT DOCUMENTS

| | | |
|---|---|---|
| 2011/0055471 A1 | 3/2011 | Thatcher |
| 2011/0060722 A1 | 3/2011 | Li |
| 2011/0072204 A1 | 3/2011 | Chang |
| 2011/0099418 A1 | 4/2011 | Chen |
| 2011/0153903 A1 | 6/2011 | Hinkle |
| 2011/0161784 A1 | 6/2011 | Selinger |
| 2011/0191525 A1 | 8/2011 | Hsu |
| 2011/0218969 A1 | 9/2011 | Anglin |
| 2011/0231598 A1 | 9/2011 | Hatsuda |
| 2011/0239083 A1 | 9/2011 | Kanno |
| 2011/0252188 A1 | 10/2011 | Weingarten |
| 2011/0258514 A1 | 10/2011 | Lasser |
| 2011/0289263 A1 | 11/2011 | McWilliams |
| 2011/0289280 A1 | 11/2011 | Koseki |
| 2011/0292538 A1 | 12/2011 | Haga |
| 2011/0296411 A1 | 12/2011 | Tang |
| 2011/0299317 A1 | 12/2011 | Shaeffer |
| 2011/0302353 A1 | 12/2011 | Confalonieri |
| 2012/0017037 A1 | 1/2012 | Riddle |
| 2012/0039117 A1 | 2/2012 | Webb |
| 2012/0084523 A1 | 4/2012 | Littlefield |
| 2012/0089774 A1 | 4/2012 | Kelkar |
| 2012/0096330 A1 | 4/2012 | Przybylski |
| 2012/0117399 A1 | 5/2012 | Chan |
| 2012/0147021 A1 | 6/2012 | Cheng |
| 2012/0151253 A1 | 6/2012 | Horn |
| 2012/0159099 A1 | 6/2012 | Lindamood |
| 2012/0159289 A1 | 6/2012 | Piccirillo |
| 2012/0173792 A1 | 7/2012 | Lassa |
| 2012/0203958 A1 | 8/2012 | Jones |
| 2012/0210095 A1 | 8/2012 | Nellans |
| 2012/0233523 A1 | 9/2012 | Krishnamoorthy |
| 2012/0246392 A1 | 9/2012 | Cheon |
| 2012/0278579 A1 | 11/2012 | Goss |
| 2012/0284587 A1 | 11/2012 | Yu |
| 2012/0324312 A1 | 12/2012 | Moyer |
| 2012/0331207 A1 | 12/2012 | Lassa |
| 2013/0013880 A1 | 1/2013 | Tashiro |
| 2013/0016970 A1 | 1/2013 | Koka |
| 2013/0018852 A1 | 1/2013 | Barton |
| 2013/0024605 A1 | 1/2013 | Sharon |
| 2013/0054822 A1 | 2/2013 | Mordani |
| 2013/0061029 A1 | 3/2013 | Huff |
| 2013/0073798 A1 | 3/2013 | Kang |
| 2013/0080391 A1 | 3/2013 | Raichstein |
| 2013/0145085 A1 | 6/2013 | Yu |
| 2013/0145089 A1 | 6/2013 | Eleftheriou |
| 2013/0151759 A1 | 6/2013 | Shim |
| 2013/0159251 A1 | 6/2013 | Skrenta |
| 2013/0159723 A1 | 6/2013 | Brandt |
| 2013/0166820 A1 | 6/2013 | Batwara |
| 2013/0173845 A1 | 7/2013 | Aslam |
| 2013/0191601 A1 | 7/2013 | Peterson |
| 2013/0205183 A1 | 8/2013 | Fillingim |
| 2013/0219131 A1 | 8/2013 | Alexandron |
| 2013/0227347 A1 | 8/2013 | Cho |
| 2013/0238955 A1 | 9/2013 | D Abreu |
| 2013/0254622 A1 | 9/2013 | Kanno |
| 2013/0318283 A1 | 11/2013 | Small |
| 2013/0318395 A1 | 11/2013 | Kalavade |
| 2013/0329492 A1 | 12/2013 | Yang |
| 2014/0006688 A1 | 1/2014 | Yu |
| 2014/0019650 A1 | 1/2014 | Li |
| 2014/0025638 A1 | 1/2014 | Hu |
| 2014/0082273 A1 | 3/2014 | Segev |
| 2014/0082412 A1 | 3/2014 | Matsumura |
| 2014/0095769 A1 | 4/2014 | Borkenhagen |
| 2014/0095827 A1 | 4/2014 | Wei |
| 2014/0108414 A1 | 4/2014 | Stillerman |
| 2014/0108891 A1 | 4/2014 | Strasser |
| 2014/0164447 A1 | 6/2014 | Tarafdar |
| 2014/0164879 A1 | 6/2014 | Tam |
| 2014/0181532 A1 | 6/2014 | Camp |
| 2014/0195564 A1 | 7/2014 | Talagala |
| 2014/0215129 A1 | 7/2014 | Kuzmin |
| 2014/0223079 A1 | 8/2014 | Zhang |
| 2014/0233950 A1 | 8/2014 | Luo |
| 2014/0250259 A1 | 9/2014 | Ke |
| 2014/0279927 A1 | 9/2014 | Constantinescu |
| 2014/0304452 A1 | 10/2014 | De La Iglesia |
| 2014/0310574 A1 | 10/2014 | Yu |
| 2014/0359229 A1 | 12/2014 | Cota-Robles |
| 2014/0365707 A1 | 12/2014 | Talagala |
| 2015/0019798 A1 | 1/2015 | Huang |
| 2015/0060009 A1* | 3/2015 | Shelnutt ............ H05K 7/20236 165/11.1 |
| 2015/0062806 A1* | 3/2015 | Shelnutt ............ H05K 7/20318 361/679.53 |
| 2015/0082317 A1 | 3/2015 | You |
| 2015/0106556 A1 | 4/2015 | Yu |
| 2015/0106559 A1 | 4/2015 | Cho |
| 2015/0121031 A1 | 4/2015 | Feng |
| 2015/0142752 A1 | 5/2015 | Chennamsetty |
| 2015/0143030 A1 | 5/2015 | Gorobets |
| 2015/0199234 A1 | 7/2015 | Choi |
| 2015/0227316 A1 | 8/2015 | Warfield |
| 2015/0234845 A1 | 8/2015 | Moore |
| 2015/0269964 A1 | 9/2015 | Fallone |
| 2015/0277937 A1 | 10/2015 | Swanson |
| 2015/0286477 A1 | 10/2015 | Mathur |
| 2015/0294684 A1 | 10/2015 | Qjang |
| 2015/0301964 A1 | 10/2015 | Brinicombe |
| 2015/0304108 A1 | 10/2015 | Obukhov |
| 2015/0310916 A1 | 10/2015 | Leem |
| 2015/0317095 A1 | 11/2015 | Voigt |
| 2015/0341123 A1 | 11/2015 | Nagarajan |
| 2015/0347025 A1 | 12/2015 | Law |
| 2015/0363271 A1 | 12/2015 | Haustein |
| 2015/0363328 A1 | 12/2015 | Candelaria |
| 2015/0372597 A1 | 12/2015 | Luo |
| 2015/0382515 A1* | 12/2015 | James ................ H05K 7/20345 361/679.47 |
| 2016/0014039 A1 | 1/2016 | Reddy |
| 2016/0026575 A1 | 1/2016 | Samanta |
| 2016/0041760 A1 | 2/2016 | Kuang |
| 2016/0048327 A1 | 2/2016 | Jayasena |
| 2016/0048341 A1 | 2/2016 | Constantinescu |
| 2016/0054922 A1 | 2/2016 | Awasthi |
| 2016/0062885 A1 | 3/2016 | Ryu |
| 2016/0077749 A1 | 3/2016 | Ravimohan |
| 2016/0077764 A1 | 3/2016 | Ori |
| 2016/0077968 A1 | 3/2016 | Sela |
| 2016/0098344 A1 | 4/2016 | Gorobets |
| 2016/0098350 A1 | 4/2016 | Tang |
| 2016/0103631 A1 | 4/2016 | Ke |
| 2016/0110254 A1 | 4/2016 | Cronie |
| 2016/0132237 A1 | 5/2016 | Jeong |
| 2016/0154601 A1 | 6/2016 | Chen |
| 2016/0155750 A1 | 6/2016 | Yasuda |
| 2016/0162187 A1 | 6/2016 | Lee |
| 2016/0179399 A1 | 6/2016 | Melik-Martirosian |
| 2016/0188223 A1 | 6/2016 | Camp |
| 2016/0188890 A1 | 6/2016 | Naeimi |
| 2016/0203000 A1 | 7/2016 | Parmar |
| 2016/0224267 A1 | 8/2016 | Yang |
| 2016/0232103 A1 | 8/2016 | Schmisseur |
| 2016/0234297 A1 | 8/2016 | Ambach |
| 2016/0239074 A1 | 8/2016 | Lee |
| 2016/0239380 A1 | 8/2016 | Wideman |
| 2016/0274636 A1 | 9/2016 | Kim |
| 2016/0306699 A1 | 10/2016 | Resch |
| 2016/0306853 A1 | 10/2016 | Sabaa |
| 2016/0321002 A1 | 11/2016 | Jung |
| 2016/0335085 A1 | 11/2016 | Scalabrino |
| 2016/0342345 A1 | 11/2016 | Kankani |
| 2016/0343429 A1 | 11/2016 | Nieuwejaar |
| 2016/0350002 A1 | 12/2016 | Vergis |
| 2016/0350385 A1 | 12/2016 | Poder |
| 2016/0364146 A1 | 12/2016 | Kuttner |
| 2016/0381442 A1 | 12/2016 | Heanue |
| 2017/0004037 A1 | 1/2017 | Park |
| 2017/0010652 A1 | 1/2017 | Huang |
| 2017/0075583 A1 | 3/2017 | Alexander |
| 2017/0075594 A1 | 3/2017 | Badam |

(56) References Cited

U.S. PATENT DOCUMENTS

| | | |
|---|---|---|
| 2017/0091110 A1 | 3/2017 | Ash |
| 2017/0109199 A1 | 4/2017 | Chen |
| 2017/0109232 A1 | 4/2017 | Cha |
| 2017/0123655 A1 | 5/2017 | Sinclair |
| 2017/0147499 A1 | 5/2017 | Mohan |
| 2017/0161202 A1 | 6/2017 | Erez |
| 2017/0162235 A1 | 6/2017 | De |
| 2017/0168986 A1 | 6/2017 | Sajeepa |
| 2017/0177217 A1 | 6/2017 | Kanno |
| 2017/0177259 A1 | 6/2017 | Motwani |
| 2017/0185498 A1 | 6/2017 | Gao |
| 2017/0192848 A1 | 7/2017 | Pamies-Juarez |
| 2017/0199823 A1 | 7/2017 | Hayes |
| 2017/0212708 A1 | 7/2017 | Suhas |
| 2017/0220254 A1 | 8/2017 | Warfield |
| 2017/0221519 A1 | 8/2017 | Matsuo |
| 2017/0228157 A1 | 8/2017 | Yang |
| 2017/0242722 A1 | 8/2017 | Qiu |
| 2017/0249162 A1 | 8/2017 | Tsirkin |
| 2017/0262176 A1 | 9/2017 | Kanno |
| 2017/0262178 A1 | 9/2017 | Hashimoto |
| 2017/0262217 A1 | 9/2017 | Pradhan |
| 2017/0269998 A1 | 9/2017 | Sunwoo |
| 2017/0279460 A1 | 9/2017 | Camp |
| 2017/0285976 A1 | 10/2017 | Durham |
| 2017/0286311 A1 | 10/2017 | Juenemann |
| 2017/0322888 A1 | 11/2017 | Booth |
| 2017/0344470 A1 | 11/2017 | Yang |
| 2017/0344491 A1 | 11/2017 | Pandurangan |
| 2017/0353576 A1 | 12/2017 | Guim Bernat |
| 2018/0024772 A1 | 1/2018 | Madraswala |
| 2018/0024779 A1 | 1/2018 | Kojima |
| 2018/0033491 A1 | 2/2018 | Marelli |
| 2018/0052797 A1 | 2/2018 | Barzik |
| 2018/0067847 A1 | 3/2018 | Oh |
| 2018/0069658 A1 | 3/2018 | Benisty |
| 2018/0074730 A1 | 3/2018 | Inoue |
| 2018/0076828 A1 | 3/2018 | Kanno |
| 2018/0088867 A1 | 3/2018 | Kaminaga |
| 2018/0107591 A1 | 4/2018 | Smith |
| 2018/0113631 A1 | 4/2018 | Zhang |
| 2018/0143780 A1 | 5/2018 | Cho |
| 2018/0150640 A1 | 5/2018 | Li |
| 2018/0165038 A1 | 6/2018 | Authement |
| 2018/0165169 A1 | 6/2018 | Camp |
| 2018/0165340 A1 | 6/2018 | Agarwal |
| 2018/0167268 A1 | 6/2018 | Liguori |
| 2018/0173620 A1 | 6/2018 | Cen |
| 2018/0188970 A1 | 7/2018 | Liu |
| 2018/0189175 A1 | 7/2018 | Ji |
| 2018/0189182 A1 | 7/2018 | Wang |
| 2018/0212951 A1 | 7/2018 | Goodrum |
| 2018/0219561 A1 | 8/2018 | Litsyn |
| 2018/0226124 A1 | 8/2018 | Perner |
| 2018/0232151 A1 | 8/2018 | Badam |
| 2018/0260148 A1 | 9/2018 | Klein |
| 2018/0270110 A1 | 9/2018 | Chugtu |
| 2018/0293014 A1 | 10/2018 | Ravimohan |
| 2018/0300203 A1 | 10/2018 | Kathpal |
| 2018/0321864 A1 | 11/2018 | Benisty |
| 2018/0322024 A1 | 11/2018 | Nagao |
| 2018/0329776 A1 | 11/2018 | Lai |
| 2018/0336921 A1 | 11/2018 | Ryun |
| 2018/0349396 A1 | 12/2018 | Blagojevic |
| 2018/0356992 A1 | 12/2018 | Lamberts |
| 2018/0357126 A1 | 12/2018 | Dhuse |
| 2018/0373428 A1 | 12/2018 | Kan |
| 2018/0373655 A1 | 12/2018 | Liu |
| 2018/0373664 A1 | 12/2018 | Vijayrao |
| 2019/0012111 A1 | 1/2019 | Li |
| 2019/0050327 A1 | 2/2019 | Li |
| 2019/0065085 A1 | 2/2019 | Jean |
| 2019/0073261 A1 | 3/2019 | Halbert |
| 2019/0073262 A1 | 3/2019 | Chen |
| 2019/0087089 A1 | 3/2019 | Yoshida |
| 2019/0087115 A1 | 3/2019 | Li |
| 2019/0087328 A1 | 3/2019 | Kanno |
| 2019/0108145 A1* | 4/2019 | Raghava ............... G06F 13/124 |
| 2019/0116127 A1 | 4/2019 | Pismenny |
| 2019/0166725 A1* | 5/2019 | Jing ................. H05K 7/20327 |
| 2019/0171532 A1 | 6/2019 | Abadi |
| 2019/0172820 A1 | 6/2019 | Meyers |
| 2019/0196748 A1 | 6/2019 | Badam |
| 2019/0196907 A1 | 6/2019 | Khan |
| 2019/0205206 A1 | 7/2019 | Hornung |
| 2019/0212949 A1 | 7/2019 | Pletka |
| 2019/0220392 A1 | 7/2019 | Lin |
| 2019/0227927 A1 | 7/2019 | Miao |
| 2019/0272242 A1 | 9/2019 | Kachare |
| 2019/0278654 A1 | 9/2019 | Kaynak |
| 2019/0317901 A1 | 10/2019 | Kachare |
| 2019/0339998 A1 | 11/2019 | Momchilov |
| 2019/0377632 A1 | 12/2019 | Oh |
| 2019/0377821 A1 | 12/2019 | Pleshachkov |
| 2019/0391748 A1 | 12/2019 | Li |
| 2020/0004456 A1 | 1/2020 | Williams |
| 2020/0004674 A1 | 1/2020 | Williams |
| 2020/0013458 A1 | 1/2020 | Schreck |
| 2020/0042223 A1 | 2/2020 | Li |
| 2020/0042387 A1 | 2/2020 | Shani |
| 2020/0084918 A1* | 3/2020 | Shen ................. H05K 7/20809 |
| 2020/0089430 A1 | 3/2020 | Kanno |
| 2020/0097189 A1 | 3/2020 | Tao |
| 2020/0143885 A1 | 5/2020 | Kim |
| 2020/0159425 A1 | 5/2020 | Flynn |
| 2020/0167091 A1 | 5/2020 | Haridas |
| 2020/0225875 A1 | 7/2020 | Oh |
| 2020/0242021 A1 | 7/2020 | Gholamipour |
| 2020/0250032 A1 | 8/2020 | Goyal |
| 2020/0257598 A1 | 8/2020 | Yazovitsky |
| 2020/0326855 A1 | 10/2020 | Wu |
| 2020/0328192 A1 | 10/2020 | Zaman |
| 2020/0348888 A1 | 11/2020 | Kim |
| 2020/0387327 A1 | 12/2020 | Hsieh |
| 2020/0401334 A1 | 12/2020 | Saxena |
| 2020/0409791 A1 | 12/2020 | Devriendt |
| 2021/0010338 A1 | 1/2021 | Santos |
| 2021/0089392 A1 | 3/2021 | Shirakawa |
| 2021/0103388 A1 | 4/2021 | Choi |
| 2021/0274687 A1* | 9/2021 | Chen ................. H05K 7/20272 |

FOREIGN PATENT DOCUMENTS

| | | |
|---|---|---|
| WO | 9418634 | 8/1994 |
| WO | 1994018634 | 8/1994 |

OTHER PUBLICATIONS

Ivan Picoli, Carla Pasco, Bjorn Jonsson, Luc Bouganim, Philippe Bonnet. "uFLIP-OC: Understanding Flash I/O Patterns on Open-Channel Solid-State Drives." APSys'17, Sep. 2017, Mumbai, India, pp. 1-7, 2017, <10.1145/3124680.3124741 >. <hal-01654985>.

EMC Powerpath Load Balancing and Failover Comparison with native MPIO operating system solutions. Feb. 2011.

Tsuchiya, Yoshihiro et al. "DBLK: Deduplication for Primary Block Storage", MSST 2011, Denver, CO, May 23-27, 2011 pp. 1-5.

Chen Feng, et al. "CAFTL: A Content-Aware Flash Translation Layer Enhancing the Lifespan of Flash Memory based Solid State Devices"< FAST'11, San Jose, CA Feb. 15-17, 2011, pp. 1-14.

Wu, Huijun et al. "HPDedup: A Hybrid Prioritized Data Deduplication Mechanism for Primary Storage in the Cloud", Cornell Univ. arXiv: 1702.08153v2[cs.DC], Apr. 16, 2017, pp. 1-14https://www.syncids.com/#.

WOW: Wise Ordering for Writes—Combining Spatial and Temporal Locality in Non-Volatile Caches by Gill (Year: 2005).

Helen H. W. Chan et al. "HashKV: Enabling Efficient Updated in KV Storage via Hashing", https://www.usenix.org/conference/atc18/presentation/chan, (Year: 2018).

S. Hong and D. Shin, "NAND Flash-Based Disk Cache Using SLC/MLC Combined Flash Memory," 2010 International Workshop on Storage Network Architecture and Parallel I/Os, Incline Village, NV, 2010, pp. 21-30.

(56) References Cited

OTHER PUBLICATIONS

Arpaci-Dusseau et al. "Operating Systems: Three Easy Pieces", Originally published 2015; Pertinent: Chapter 44; flash-based SSDs, available at http://pages.cs.wisc.edu/~remzi/OSTEP/.

Jimenex, X., Novo, D. and P. Ienne, "Pheonix:Reviving MLC Blocks as SLC to Extend NAND Flash Devices Lifetime, "Design, Automation & Text in Europe Conference & Exhibition (Date), 2013.

Yang, T. Wu, H. and W. Sun, "GD-FTL: Improving the Performance and Lifetime of TLC SSD by Downgrading Worn-out Blocks," IEEE 37th International Performance Computing and Communications Conference (IPCCC), 2018.

C. Wu, D. Wu, H. Chou and C. Cheng, "Rethink the Design of Flash Translation Layers in a Component-Based View", in IEEE Acess, vol. 5, pp. 12895-12912, 2017.

Po-Liang Wu, Yuan-Hao Chang and T. Kuo, "A file-system-aware FTL design for flash-memory storage systems," 2009, pp. 393-398.

S. Choudhuri and T. Givargis, "Preformance improvement of block based NAND flash translation layer", 2007 5th IEEE/ACM/IFIP International Conference on Hardware/Software Codesign and Systems Synthesis (CODES+ISSS). Saizburg, 2007, pp. 257-262.

A. Zuck, O. Kishon and S. Toledo. "LSDM: Improving the Preformance of Mobile Storage with a Log-Structured Address Remapping Device Driver", 2014 Eighth International Conference on Next Generation Mobile Apps, Services and Technologies, Oxford, 2014, pp. 221-228.

J. Jung and Y. Won, "nvramdisk: A Transactional Block Device Driver for Non-Volatile RAM", in IEEE Transactions on Computers, vol. 65, No. 2, pp. 589-600, Feb. 1, 2016.

Te I et al. (Pensieve: a Machine Assisted SSD Layer for Extending the Lifetime: (Year: 2018).

ARM ("Cortex-R5 and Cortex-R5F", Technical reference Manual, Revision r1p1) (Year:2011).

* cited by examiner

METHOD AND SYSTEM FOR FACILITATING A CONVERGED COMPUTATION AND STORAGE NODE IN A DISTRIBUTED STORAGE SYSTEM

BACKGROUND

Field

This disclosure is generally related to the field of data storage. More specifically, this disclosure is related to a method and system for facilitating a converged computation and storage node in a distributed storage system.

Related Art

Today, various storage systems are being used to store and access the ever-increasing amount of digital content. Some technological fields or areas may require analysis of a large amount of data, e.g., big data analysis. In such fields, a distributed storage system or distributed cluster may divide computation-heavy tasks into multiple partitions or sub-tasks, where the sub-tasks may be performed in parallel by multiple nodes in the distributed cluster. A single node in such a distributed cluster can include both computation and storage capability. A single node can be a conventional server in a distributed cluster, and can use a central processing unit (CPU) as a central hub to manage traffic among devices or components in the node or server. Because certain computation workloads may not be friendly or optimal for a CPU, various heterogeneous processors can be used as Peripheral Component Interconnect Express (PCIe) devices to handle the main computation tasks. Examples of heterogeneous processors include a general processing unit (GPU) and a field programmable gate array (FPGA). The heterogeneous processors can generally be used in a conventional server as a PCIe add-in card (AIC). By shifting the main computation tasks from the CPU to the heterogeneous processors, a distributed system can deploy the CPU with a decreased cost and power consumption.

However, the conventional server or node architecture can involve multiple layers of memory copy and bus protocols, which can result in a high consumption of resources and power as well as a sub-optimal operational efficiency. Furthermore, despite the decreased cost of CPU usage in conventional servers, the cost of using CPU cores for management instead of computation tasks still remains high.

SUMMARY

In one embodiment, a printed circuit board comprises: a network controller; a memory controller; a heterogeneous processor; a field-programmable gate array (FPGA); and a non-volatile-media controller. The memory controller comprises: a fabric controller component configured to communicate with the network controller, the heterogeneous processor, the FPGA, and the non-volatile-media controller; and a media controller component configured to manage access relating to data stored in a volatile memory media. The FPGA is configured to perform computations relating to data stored via the non-volatile-media controller. The heterogeneous processor is configured to perform computation tasks relating to data stored via the memory controller.

In some embodiments, the fabric controller is further configured to manage data received and transmitted via an internal bus protocol to communicate with the network controller, the heterogeneous processor, the FPGA, and the non-volatile-media controller.

In some embodiments, the printed circuit board further comprises: a power module; a monitoring and operating module; and at least one network interface configured to receive data from another node or computing device and further configured to transmit data to the network controller.

In some embodiments, the printed circuit board is immersed in a liquid cooling medium.

In some embodiments, the network controller is an Ethernet controller, the non-volatile-media controller is a NAND controller, and the memory controller is a DRAM controller.

In some embodiments, the network controller further comprises: at least one static random-access memory (SRAM) or embedded dynamic random-access memory (DRAM); an Ethernet interface; at least one ARM core; a bus switch; and a bus root complex or an endpoint.

In some embodiments, the printed circuit board is configured to be plugged into a rack with a plurality of other plugged-in circuit boards. The printed circuit board comprises a node, the other plugged-in circuit boards comprise nodes, and each node is connected to one of a plurality of switches in the rack.

In some embodiments, a switch is an Ethernet switch or an access switch.

In some embodiments, the rack is immersed with the plugged-in plurality of nodes in a liquid cooling tank. A defective node of the immersed rack is identified. The defective node is removed without affecting operation of the rack or a remainder of the nodes in the rack. The defective node is replaced or repaired to obtain a new node. The new node is plugged into the rack by immersing the new node in the liquid cooling tank at a location previously occupied by the defective node.

Another system provides a method for facilitating operation of a storage system. During operation, the system receives, by a network controller of a device, a request to write first data to a non-volatile memory of the device, wherein the device comprises: the network controller; a memory controller; a heterogeneous processor; a field-programmable gate array (FPGA); and a non-volatile-media controller. The memory controller comprises: a fabric controller component configured to communicate with the network controller, the heterogeneous processor, the FPGA, and the non-volatile-media controller; and a media controller component configured to manage access relating to data stored in a volatile memory media. The system performs, by the heterogeneous processor, computation tasks relating to the first data and data stored via the memory controller. The system performs, by the FPGA, computations relating to the first data and data stored via the non-volatile-media controller. The system writes, by the non-volatile-media controller, the first data to a non-volatile media of the device.

BRIEF DESCRIPTION OF THE FIGURES

In the figures, like reference numerals refer to the same figure elements.

DETAILED DESCRIPTION

Figure 1A:
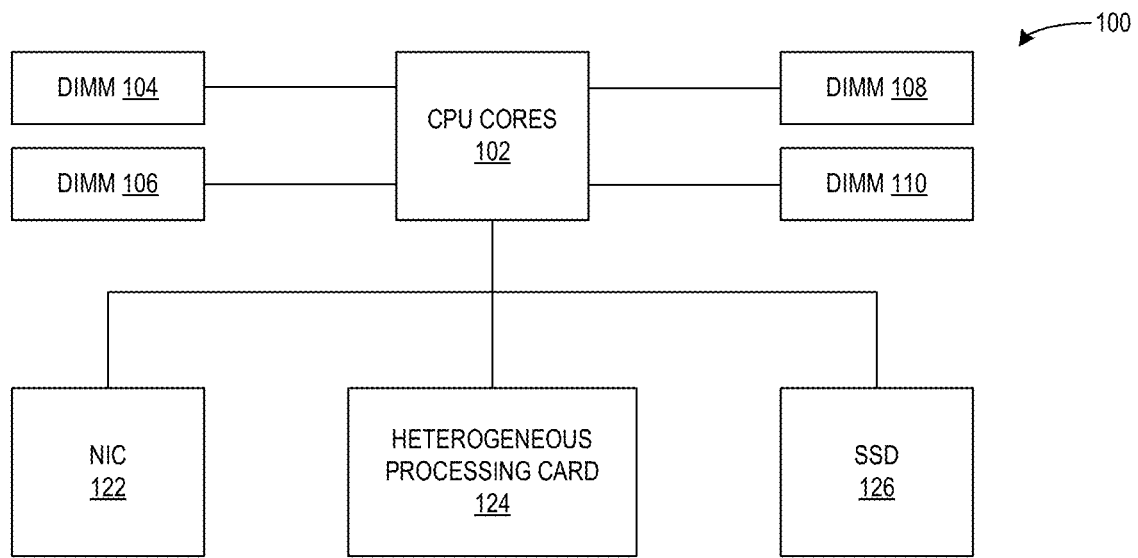
FIG. 1A illustrates an architecture of an exemplary node in a storage system, in accordance with the prior art.

The following description is presented to enable any person skilled in the art to make and use the embodiments, and is provided in the context of a particular application and its requirements. Various modifications to the disclosed embodiments will be readily apparent to those skilled in the art, and the general principles defined herein may be applied to other embodiments and applications without departing from the spirit and scope of the present disclosure. Thus, the embodiments described herein are not limited to the embodiments shown, but are to be accorded the widest scope consistent with the principles and features disclosed herein.

Overview

The embodiments described herein facilitate a distributed storage system with converged computation and storage nodes without using a general CPU, which can improve the efficiency and performance of the storage system.

As described above, in technological fields requiring analysis of large amounts of data (such as big data analysis), a distributed storage system or distributed cluster may divide computation-heavy tasks into multiple partitions or sub-tasks, where the sub-tasks may be performed in parallel by multiple nodes in the distributed cluster. A single node in such a distributed cluster can include both computation and storage capability. A single node can be a conventional server in a distributed cluster, and can use a CPU as a central hub to manage traffic among devices or components in the node or server. Because certain computation workloads may not be friendly or optimal for a CPU, various heterogeneous processors can be used as PCIe devices to handle the main computation tasks. Examples of heterogeneous processors include a GPU and an FPGA. The heterogeneous processors can generally be used in a conventional server as a PCIe AIC. By shifting the main computation tasks from the CPU to the heterogeneous processors, a distributed storage system can deploy the CPU with a decreased cost and power consumption.

However, the conventional server or node architecture can involve multiple layers of memory copy and bus protocols, which can result in a high consumption of resources and power as well a sub-optimal operational efficiency. Furthermore, despite the decreased cost of CPU usage in conventional servers, the cost of using CPU cores for management instead of computation tasks still remains high. An exemplary conventional server is described below in relation to FIGS. 1A and 1B.

The embodiments described herein addresses these challenges by providing a converged computation and storage node which includes a network controller and a memory controller which is directly accessible via the network controller and other components of the node. The node can be a single printed circuit board with multiple components or integrated circuits (ICs). The node can include: the network controller, which can be an Ethernet controller; the memory controller, which can be a DRAM controller (or a "standalone DRAM controller"); a heterogeneous processor; a storage field-programmable gate array (FPGA); and a non-volatile media controller, which can be a NAND controller. The storage FPGA can be configured to perform computations relating to data stored via the NAND controller, and the heterogeneous processor can be configured to perform computation tasks. The NAND controller can be configured to manage high-capacity NAND flash. The Ethernet controller can be configured to communicate with other nodes and extend the data processing and storage functions within an internal bus. Thus, the node can provide both computation and storage functionality, and can be referred to as "a converged computation and storage node."

In this converged computation and storage node, the standalone DRAM controller can be used and accessed directly by the heterogeneous processor, the storage FPGA, the NAND controller, and the Ethernet controller through a peer-to-peer direct memory access. This converged node can thus eliminate the need for a middle layer between an initiator and a target of the bus, which can result in a decrease in the amount of overhead traditionally associated with copying data to and from memory, as described below in relation to FIGS. 1A, 1B, and 2. Furthermore, the converged node does not need to include a general CPU, which can result in further improvements in performance, cost, and efficiency.

Thus, by placing both computation and storage functionality in a single node (e.g., a printed circuit board), the system can eliminate the need to use a CPU, which can result in an improvement in performance and a reduction in power consumption through use of the heterogeneous processors, which can provide the computation power. In the single node, the system can further provide direct access to the node's memory controller via several other node components, including a heterogeneous processor, a storage FPGA, and a NAND controller. These improvements can result in a more efficient distributed storage system.

A "storage system infrastructure," "storage infrastructure," or "storage system" refers to the overall set of hardware and software components used to facilitate storage for a system. A storage system can include multiple clusters of storage servers and other servers. A "storage server" refers to a computing device which can include multiple storage devices or storage drives. A "storage device" or a "storage drive" refers to a device or a drive with a non-volatile memory which can provide persistent storage of data, e.g., a solid state drive (SSD), a hard disk drive (HDD), or a flash-based storage device.

A "computing device" refers to any server, device, node, entity, drive, or any other entity which can provide any computing capabilities.

A "node" refers to a device or printed circuit board which can be used in a distributed storage system. A "converged computation and storage node" refers to a node which includes functionality for both computation and storage, and can include the components, modules, unit, or ICs as described herein.

A "network controller" refers to a controller which can be configured to manage, handle, or otherwise process traffic received from and transmitted via, e.g., an Ethernet interface. A network controller can include the Ethernet interface, SRAM/embedded DRAM (eDRAM), a bus switch, a bus root complex, and ARM cores which provide conversion between Ethernet and an internal bus. A network controller can also communicate with or be coupled to a "memory controller" (see term below). An exemplary network controller is described below in relation to FIG. 3.

A "heterogeneous processor" refers to a processor which can be configured to perform computation tasks, including high-cost tasks requiring high-performance, e.g., related to artificial intelligence and big data analysis.

A "non-volatile-media controller" refers to a controller, component, unit, module, IC, software, firmware, or hardware component which can be configured to manage, process, store, or other handle data stored in or to be stored in a non-volatile memory of a system. An example of a non-volatile media is NAND flash, and an example of a non-volatile-media controller is a NAND controller.

A "storage FPGA" refers to an FPGA which can be configured to perform computations relating to data stored or to be stored, e.g., via a non-volatile media controller of the same node or PCB.

A "memory controller" refers to a controller which can be configured to manage, process, store, or otherwise handle data stored in or to be stored in a volatile memory of a system. An example of a memory controller is a DRAM controller. In this disclosure, a memory controller can include a "fabric controller" and a "media controller." The fabric controller can be used to manage data received from and transmitted via an internal bus protocol to communicate with other components or devices, including, but not limited to, a network controller, a storage FPGA, a heterogeneous processor, and a non-volatile-media controller. The media controller can be configured to handle the access of data stored in the non-volatile media and to provide reliability assurance of the stored data based on the characteristics of the non-volatile media.

Architecture of Exemplary Node and Environment in the Prior Art

FIG. 1A illustrates an architecture of an exemplary node 100 in a storage system, in accordance with the prior art. Node 100 can include: CPU cores 102 with associated dual in-line memory modules (DIMMs) 104, 106, 108, and 110; a network interface card 122; a heterogeneous processing card 124; and at least one solid state drive (SSD) 126. Node 100 can use CPU cores 102 as a central hub to manage all traffic among devices and components in the node, where the nodes are connect connected with a high-speed Ethernet to form a distributed storage system (or a distributed cluster, as in FIG. 1B).

Figure 1B:
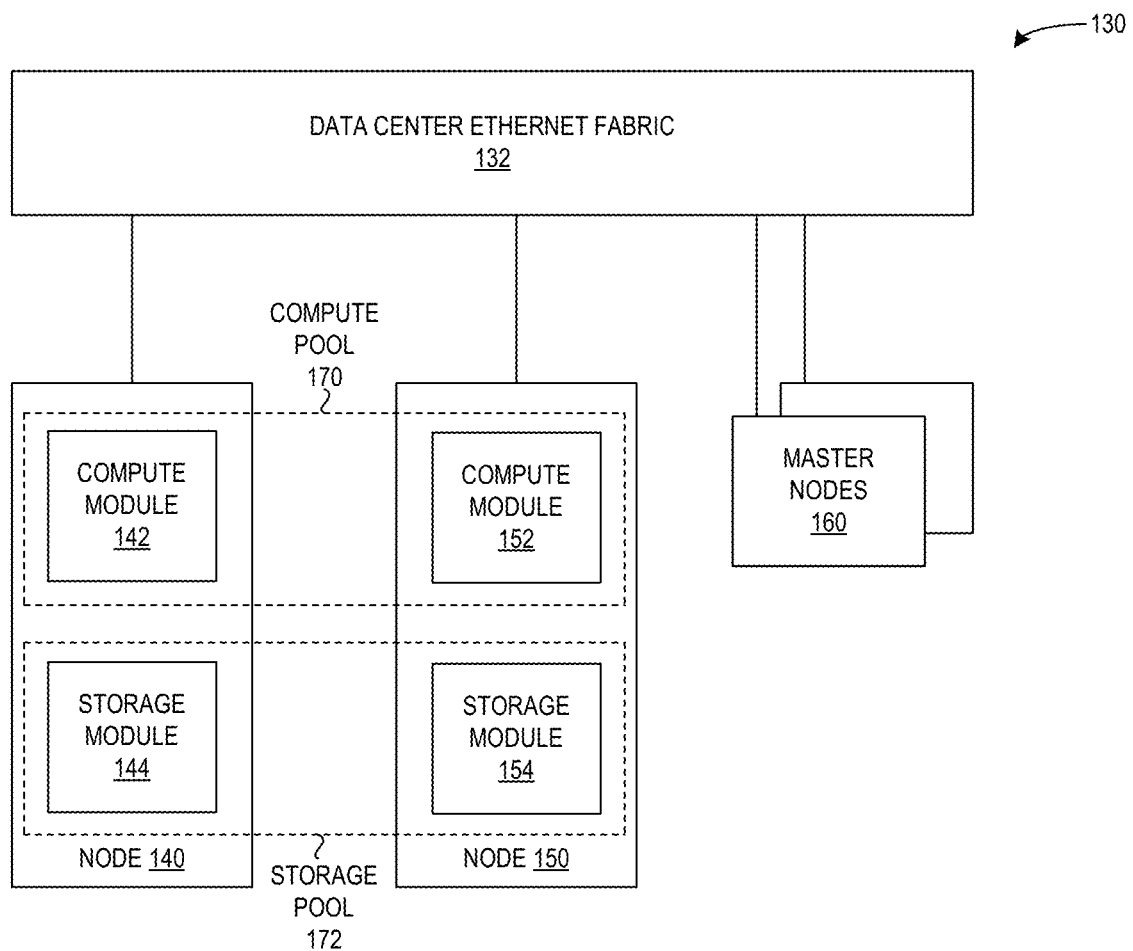
FIG. 1B illustrates an exemplary environment for a distributed cluster with resource pooling, in accordance with the prior art.

FIG. 1B illustrates an exemplary environment 130 for a distributed cluster with resource pooling, in accordance with the prior art. Environment 130 can include: a data center Ethernet fabric 132; a plurality of nodes, including a node 140 and a node 150; and master nodes 160. Each node can include a compute module and a storage module. The compute modules across multiple nodes or all nodes of a cluster can form a compute pool, and the storage modules across multiple nodes or all nodes of a cluster can form a storage pool. For example, node 140 can include a compute module 142 and a storage module 144, and node 150 can include a compute module 152 and a storage module 154. Compute modules 142 and 152 can form a compute pool 170, while storage modules 144 and 154 can form a storage pool 172.

At the same time, due to the increasing demand to improve the efficiency of data processing (e.g., in fields such as big data analysis), heterogeneous processors can generally be used in a conventional server as a PCIe AIC. By shifting the main computation tasks from the CPU to the heterogeneous processors, the CPU can be deployed with a decreased cost and low power consumption. However, the conventional server or node architecture can involve multiple layers of memory copy and bus protocols, which can result in high consumption of resources and power, and a sub-optimal operational efficiency. Furthermore, despite the decreased cost of CPU usage in conventional servers, the cost of using CPU cores for management instead of computation tasks still remains high.

In addition to the cost of the CPU, the conventional server is limited by several other constraints. First, CPU sources are limited. Only a few vendors fabricate or manufacture CPUs, which can result in frequent challenges in the supply chain. Second, power utilization can be difficult to control in the conventional server. Because the CPU is no longer performing the main computation tasks (at least in certain compute scenarios), the high power consumption can result in a non-trivial constraints on the deployment of the servers and the optimization of the total cost of operation (TCO). It may be sub-optimal to spend major resources (in terms of cost, components, performance, TCO, etc.) on what may be considered a secondary module (i.e., the CPU). Third, the performance of the storage system can face a bottleneck due to the usage of the CPU and the conventional node and cluster architecture. Moreover, the memory bandwidth, memory copy, and protocol overhead may all act as further constraints on the optimization of the performance of the storage system.

Thus, the conventional server which uses the CPU as the central hub can be limited by several constraints which can limit the optimization of a distributed storage system.

Exemplary Converged Computation and Storage Node

Figure 2:
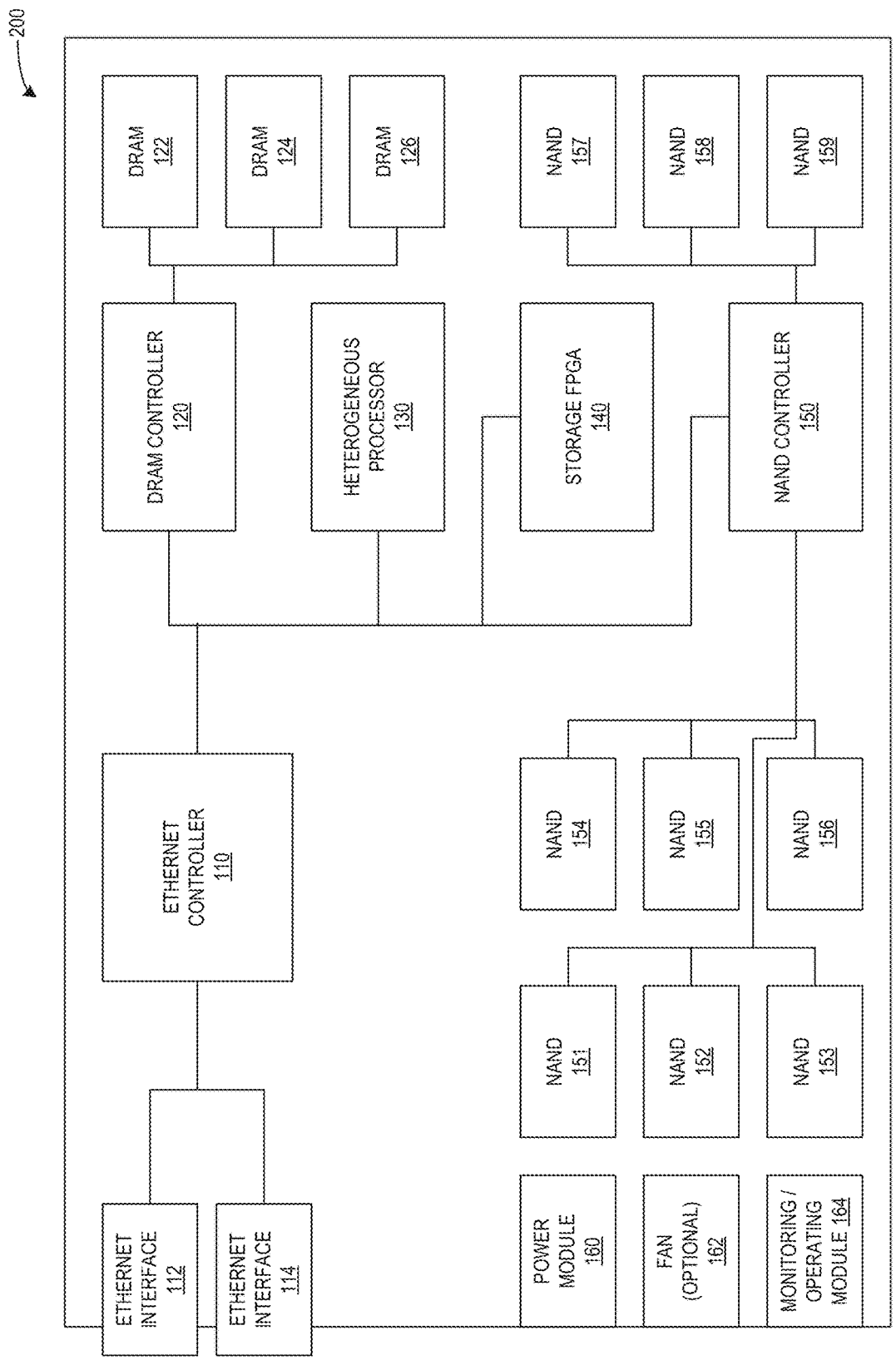
FIG. 2 illustrates a board as a converged computation and storage node in a storage system, in accordance with an embodiment of the present application.

FIG. 2 illustrates a board 200 as a converged computation and storage node in a storage system, in accordance with an embodiment of the present application. Board 200 can be a printed circuit board (PCB), and can include: an Ethernet controller 110 accessed via an Ethernet interface 112 and an Ethernet interface 114; a DRAM controller 120, which is coupled to DRAMs 122, 124, and 126; a heterogeneous processor 130; a storage FPGA 140; a NAND controller 150, which is coupled to NANDs 151-159; a power module 160; an optional fan 162; and a monitoring/operating module 164. Ethernet controller 110 can provide the root complex of a bus which connects DRAM controller 120, heterogeneous processor 130, storage FPGA 140, and NAND controller 150. DRAM controller 120 (a "memory controller") can be directly used by Ethernet controller 110 (a network controller), heterogeneous processor 130, storage FPGA 140, and NAND controller 150 (a non-volatile-media controller). DRAM controller 120 is accessible via the other components through a peer-to-peer direct memory access. This "converged node" can thus eliminate the need for a middle layer between an initiator and a target of the bus, which can result in a decrease in the amount of overhead traditionally associated with copying data to and from memory.

NAND controller 150 can be configured to manage the high-capacity NAND flash. Storage FPGA 140 can be configured with customized functions to perform computations or computation tasks relating to data stored via NAND controller 150. Heterogeneous processor 130 can be configured to perform computations relating to data stored via DRAM controller 120. These computations can include main computation tasks relating to, e.g., artificial intelligence and big data analysis. Ethernet controller 110 can be configured to communicate with other nodes and to extend the processing and storage of data using the internal bus. Monitoring/operating module 164 can be configured to perform monitoring and operating functions relating to operation of the node, including receiving, processing, accessing, handling, directing, and storing data.

Thus, by providing computation and storage functionality in the above described manner in converged nodes without requiring a central CPU in each node, the embodiments described herein provide converged nodes in a distributed storage system which can improve the optimization and efficiency of the distributed storage system.

Exemplary Network Controller

Figure 3:
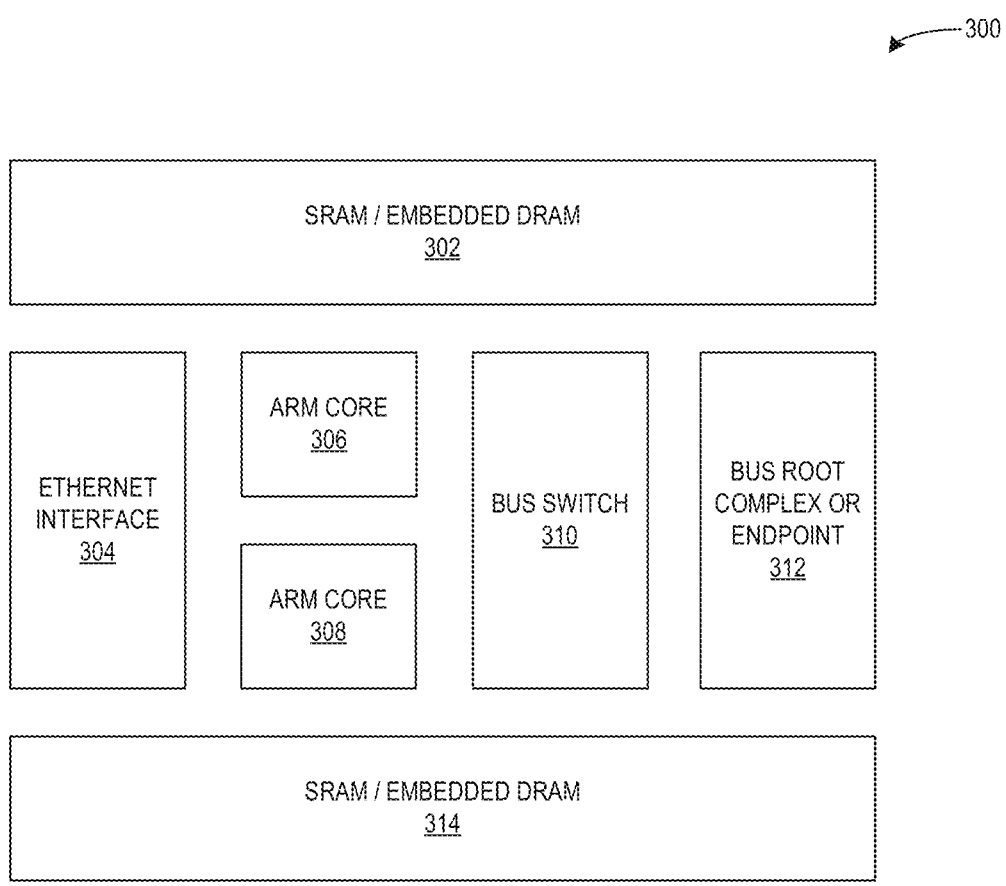
FIG. 3 illustrates an exemplary Ethernet controller, in accordance with an embodiment of the present application.

FIG. 3 illustrates an exemplary Ethernet controller 300, in accordance with an embodiment of the present application. Ethernet controller 300 can include: an SRAM/embedded DRAM (eDRAM) 302; an Ethernet interface 304; Advanced RISC Machines (ARM) cores 306 and 308; a bus switch 310; a bus root complex or endpoint 312; and an SRAM/embedded DRAM (eDRAM) 314. ARM cores 306 and 308 can provide the conversion between the Ethernet and the internal bus (e.g., Ethernet interface 304 and bus switch 310). SRAMs/embedded DRAMs (eDRAMSs) 302 and 314 can provide an internal data buffer for low-latency access.

Exemplary Rack and Immersion in Liquid Cooling Tank

Figure 4A:
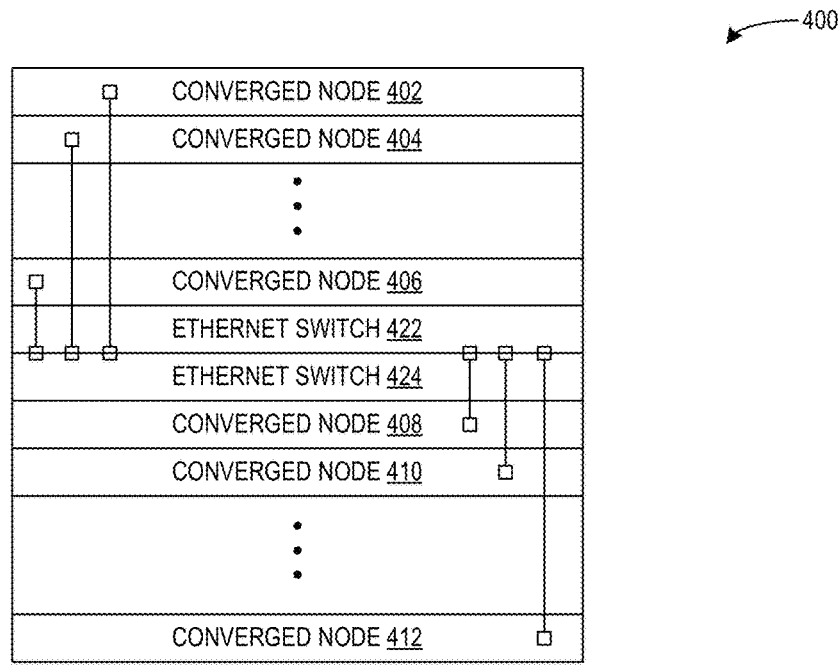
FIG. 4A illustrates a design of an exemplary rack with converged computation and storage nodes, in accordance with an embodiment of the present application.

FIG. 4A illustrates a design of an exemplary rack 400 with converged computation and storage nodes, in accordance with an embodiment of the present application. Rack 400 can include a plurality of converged nodes (e.g., 402, 404, 406, 408, 410, and 412) and at least one Ethernet switch (e.g., 422 and 424). Each converged node can be connected or coupled to an Ethernet switch, as depicted by the six lines between each converged node and Ethernet switches 422 and 424. As discussed above, a converged node (as in FIG. 2) can integrate or include multiple ICs on a single printed circuit board. This can result in a straightforward handling of both the mechanical design and the thermal dissipation of the converged nodes and an associated rack, e.g., in a data center. As a result of the mechanical design, because each node is a single PCB which can be plugged into the rack and coupled to a given Ethernet switch, no separate chassis or other module covering or fitting or container is required in order to insert or include the node in the rack. Furthermore, the volume or size of a node as a single PCB is smaller than the volume or size of a conventional server, which can result in occupying less space in the rack and increasing the overall density of nodes in the rack.

In a conventional server rack, the converged storage nodes of FIG. 4A are connected to Ethernet switches 422 and 424 in the middle of the rack. Given the increased density of converged computation and storages nodes in rack 400, the air cooling required to properly handle the thermal dissipation of the converged nodes would still require equipping fans in the converged nodes. One solution is to utilize the mechanical design of the converged storage nodes and place or immerse rack 400 in a liquid cooling medium, such as a liquid immersion cooling tank, as described below in relation to FIG. 4B.

Figure 4B:
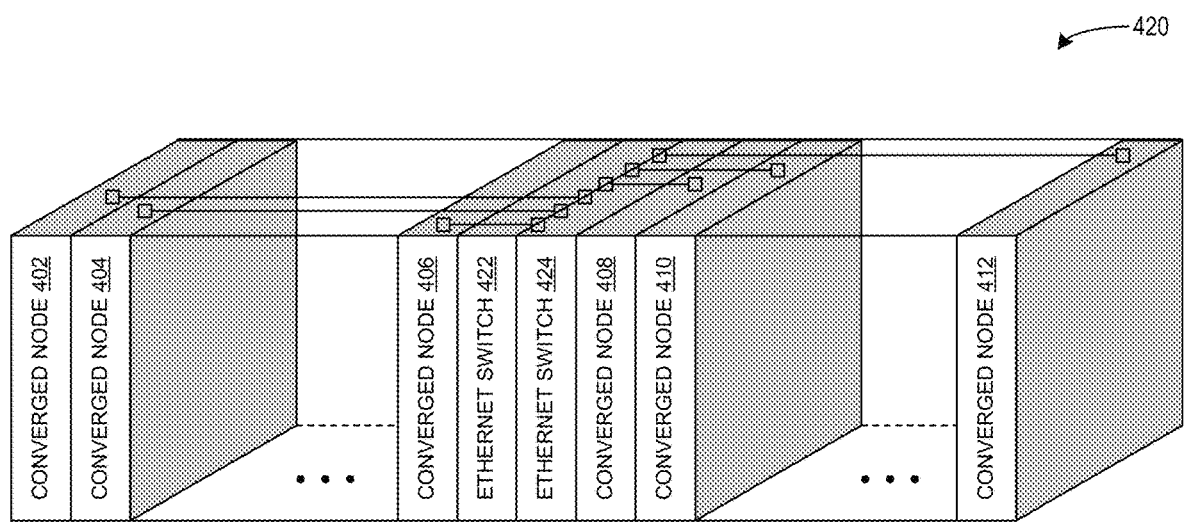
FIG. 4B illustrates the exemplary rack of FIG. 4A in a liquid immersion cooling tank, in accordance with an embodiment of the present application.

FIG. 4B illustrates exemplary rack 400 of FIG. 4A in a liquid immersion cooling tank 420, in accordance with an embodiment of the present application. Each converged node of rack 400 can be a PCB with multiple electronic devices or ICs, and each single PCB can be placed in its entirety in liquid immersion cooling tank 420. Rack 400 can include converged nodes (402-412) and Ethernet switches (422 and 424) and can also include power cords and Ethernet cables. The cords and cables may or may not be immersed in liquid immersion cooling tank 420. The cooling liquid of liquid immersion cooling tank 420 may not be conductive. The system (or a system administrator, operator, or other user) can identify a defective node or PCB of immersed rack 400, and can remove the defective node or PCB without affecting the operation of rack 400 or the remainder of the nodes or PCBs in rack 400. The system can replace or repair the defective node to obtain a new node, and can plug the new node into the rack by immersing the new nodes in the liquid tank at a location previously occupied by the defective node, or in a different available location in immersed rack 400.

Figure 5:
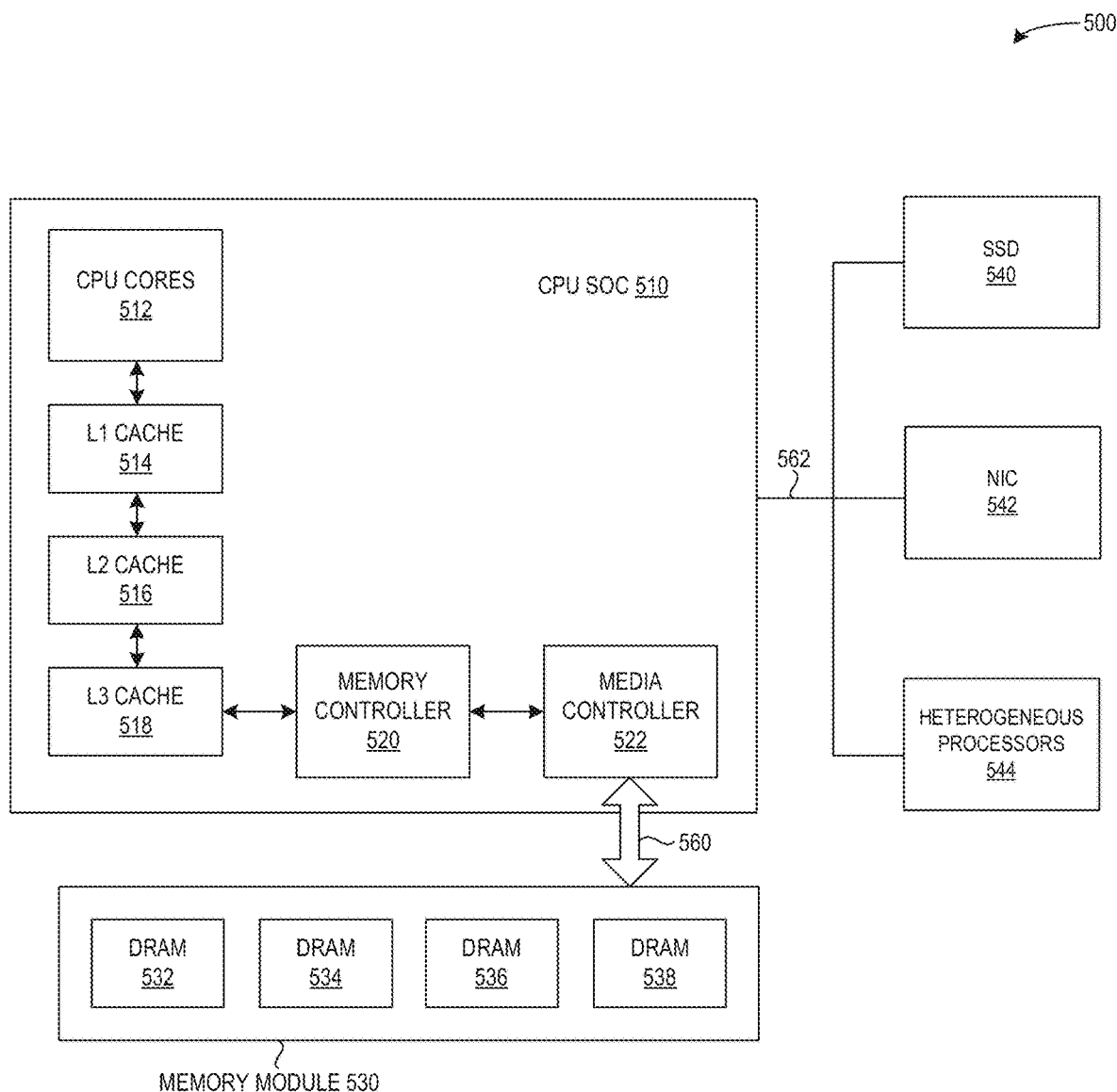
FIG. 5 illustrates an exemplary environment for accessing memory in a storage system, in accordance with the prior art.

Exemplary Environment for Accessing Memory in the Prior Art vs. in a Converged Computation and Storage Node FIG. 5 illustrates an exemplary environment 500 for accessing memory in a storage system, in accordance with the prior art. Environment 500 can include: a CPU system on chip (SOC) 510; an SSD 540; a NIC 542; heterogeneous processors 544; and a memory module 530 with DRAMs 532-538. CPU SOC 510 can include: CPU cores 512; an L1 cache 514; an L2 cache 516; an L3 cache 518; a memory controller 520; and a media controller 522. Memory controller 520 communicates with L3 cache 518, where data moves from CPU cores 512 to L3 cache by passing through both of L1 cache 514 and L2 cache 516. Memory controller 520 can also communicate with media controller 522, which in turn can communicate with or otherwise access DRAMs 532-538 of memory module 530. CPU SOC 510 can use multiple PCIe lanes to communicate with SSD 540, NIC 542, and heterogeneous processors 544 (via a communication 562).

In prior art environment 500, memory module 530 is depicted as a passive data bucket because both memory controller 520 and media controller 522 are located on CPU SOC 510. Media controller 512 is designed as a slave of CPU SOC 510, which causes all DRAM usage to travel or go through CPU SOC 510. Using CPU SOC 510 as a central hub like this can result in a significant overhead in the performance of the distributed storage system.

Figure 6:
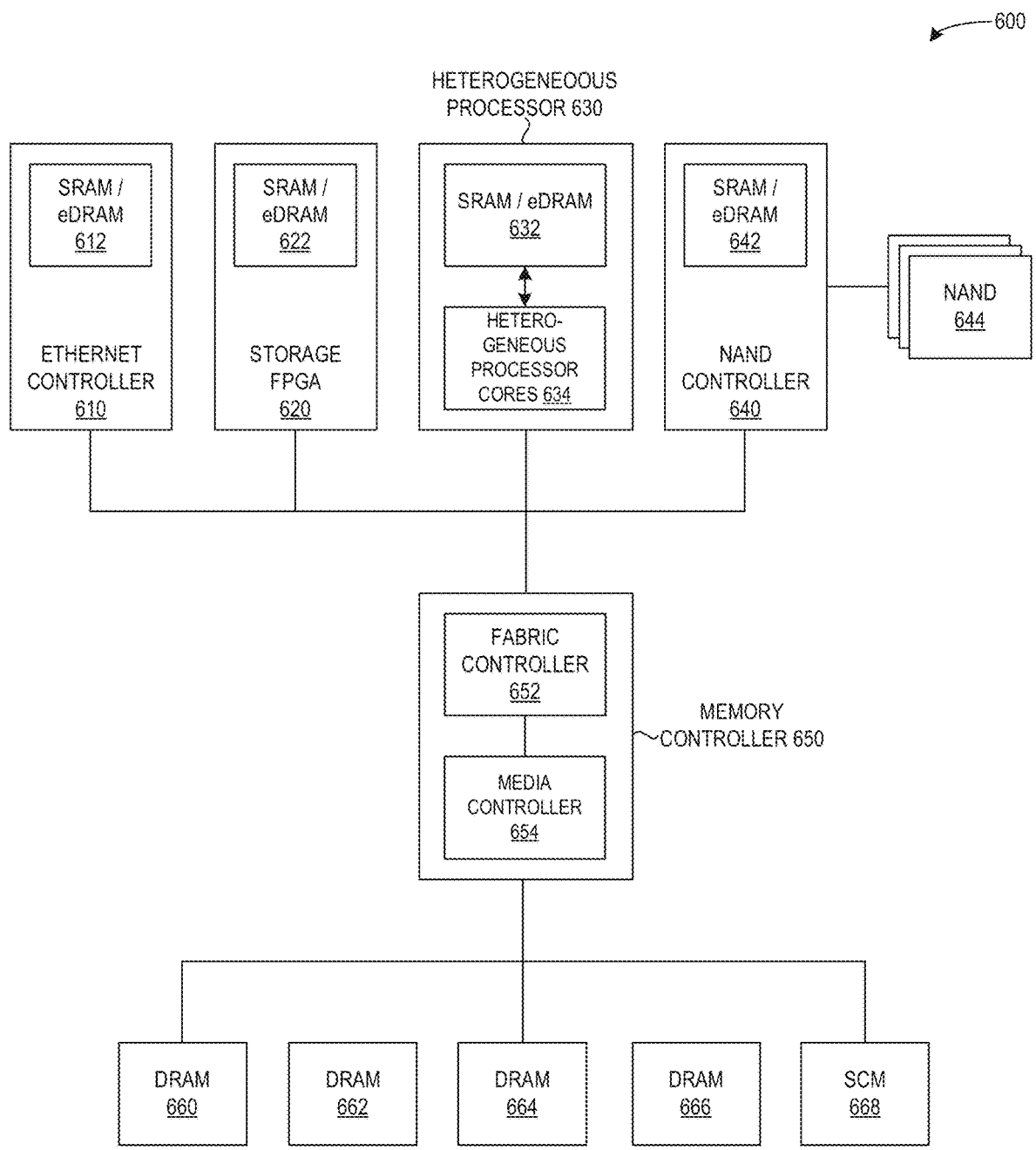
FIG. 6 illustrates an exemplary environment for accessing memory in a converged computation and storage node, in accordance with an embodiment of the present application.

FIG. 6 illustrates an exemplary environment 600 for accessing memory in a converged computation and storage node, in accordance with an embodiment of the present application. Environment 600 can include: an Ethernet controller 610 with an SRAM/eDRAM 612; a storage FPGA 620 with an SRAM/eDRAM 622; a heterogeneous processor 630 which includes heterogeneous processor cores 634 with an SRAM/eDRAM 632; a NAND controller 640 with an SRAM/eDRAM 642; and a memory controller 650 which includes a fabric controller 652 and a media controller 654. NAND controller 640 can communicate with or be coupled to NAND 644, and memory controller 650 (via a media controller 654) can communicate with or be coupled to DRAMs 660-666 and a storage class memory (SCM) 668.

Memory controller 650 can include two components or modules: fabric controller 652 and media controller 654. Fabric controller 652 can be configured to communicate with Ethernet controller 610, heterogeneous processor 630, storage FPGA 620, and NAND controller 640. Media controller 654 can be configured to communicate with volatile memory (e.g., DRAMs 660-666) and other types of memory (e.g., SCM 668). Each of Ethernet controller 610, heterogeneous processor 630, storage FPGA 620, and NAND controller 640 can directly access memory controller 650, and can thus access data stored in or to be stored in DRAMs 660-666 and SCM 668.

Thus, the embodiments described herein provide a distributed storage system with converged computation and storage nodes which communicate via an Ethernet connection. These converged nodes can result in an improvement in the efficiency and performance of the overall distributed storage system by removing the traditional CPU sockets, which can also result in a reduction in both cost and power consumption in scenarios in which a heterogeneous processor can provide computation power. The described memory controller can be shared by the heterogeneous processor, the storage FPGA, the non-volatile-media controller (the NAND controller), and the network controller (the Ethernet controller), but the system can allocate and recycle the memory capacity and space individually without sharing in order to ensure coherence.

Method for Facilitating Operation of a Storage System

Figure 7A:
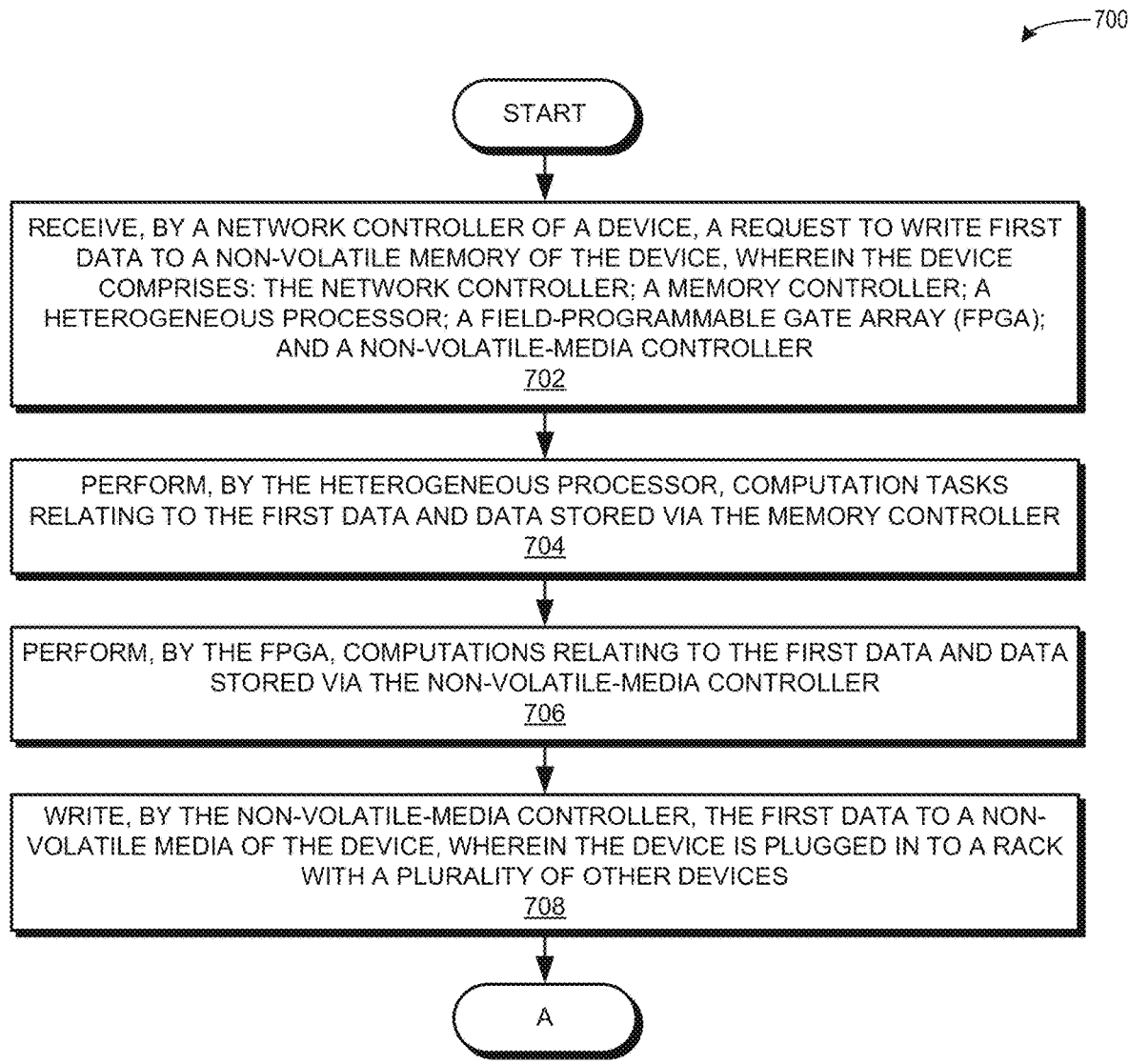
FIG. 7A presents a flowchart illustrating a method for facilitating operation of a storage system, in accordance with an embodiment of the present application.

FIG. 7A presents a flowchart 700 illustrating a method for facilitating operation of a storage system, in accordance with an embodiment of the present application. During operation, the system receives, by a network controller of a device, a request to write first data to a non-volatile memory of the device, wherein the device comprises: the network controller; a memory controller; a heterogeneous processor; a field-programmable gate array (FPGA); and a non-volatile-media controller (operation 702). The memory controller comprises: a fabric controller component configured to communicate with the network controller, the heterogeneous processor, the FPGA, and the non-volatile-media controller; and a media controller component configured to manage access relating to data stored in a volatile memory media. The system performs, by the heterogeneous processor, computation tasks relating to the first data and data stored via the memory controller (operation 704). The system performs, by the FPGA, computations relating to the first data and data stored via the non-volatile-media controller (operation 706). The system writes, by the non-volatile-media controller, the first data to a non-volatile media of the device (operation 708). The device can be plugged in to a rack with a plurality of other devices.

Figure 7B:
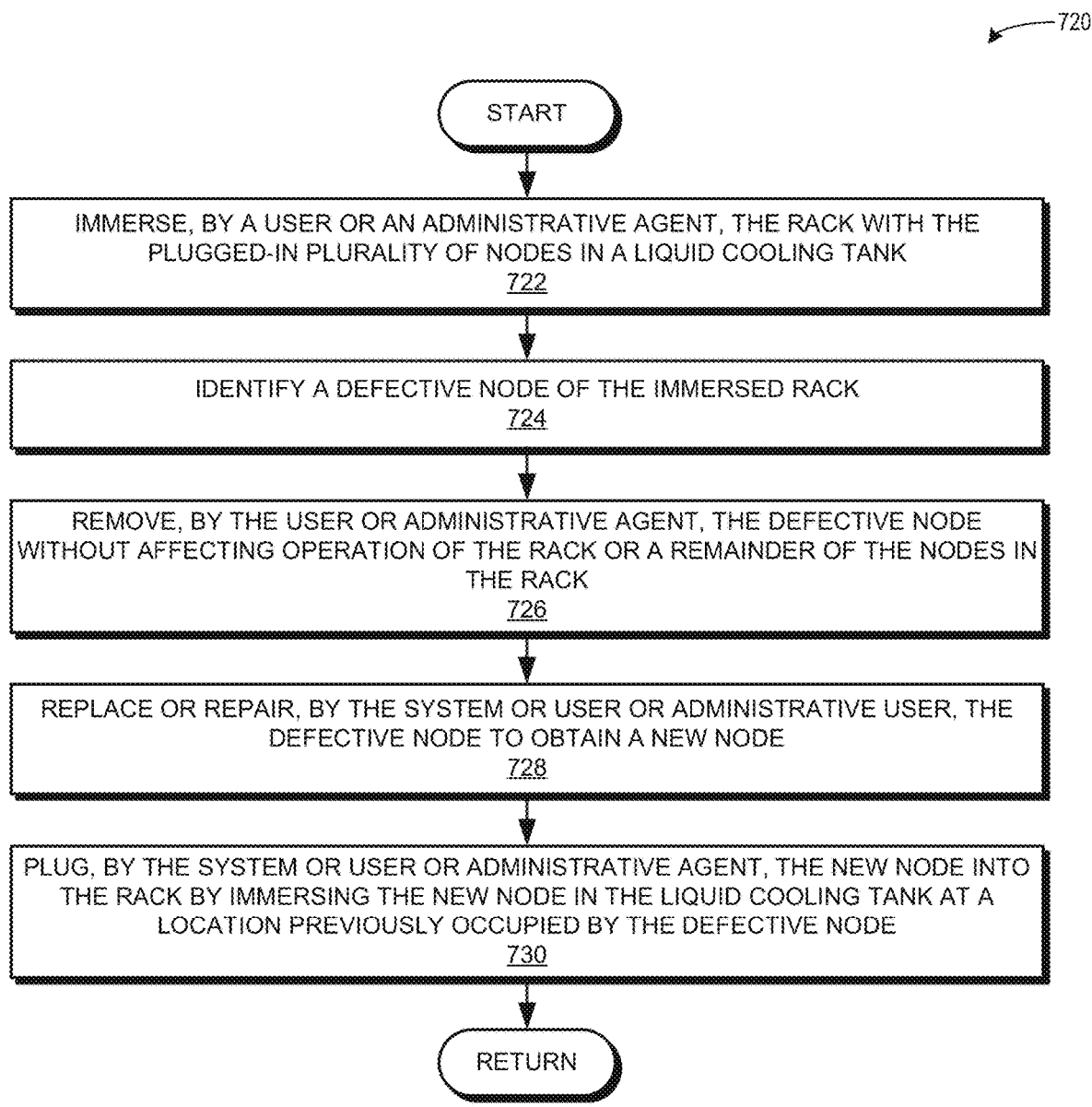
FIG. 7B presents a flowchart illustrating a method for facilitating operation of a storage system, in accordance with an embodiment of the present application.

As described above, the device can be a printed circuit board, and the rack can be immersed into a liquid cooling tank. FIG. 7B presents a flowchart 720 illustrating a method for facilitating operation of a storage system, in accordance with an embodiment of the present application. During operation, a user or an administrative agent can immerse the rack with the plugged-in plurality of nodes in a liquid cooling tank (operation 722). The system can identify a defective node of the immersed rack (operation 724). The user or administrative agent can remove the defective node without affecting operation of the rack or a remainder of the nodes in the rack (operation 726). The system or user or other system can replace or repair the defective node to obtain a new node (operation 728). The system or user or administrative agent can plug the new node into the rack by immersing the new node in the liquid cooling tank at a location previously occupied by the defective node (operation 730).

Exemplary Computer System and Apparatus

Figure 8:
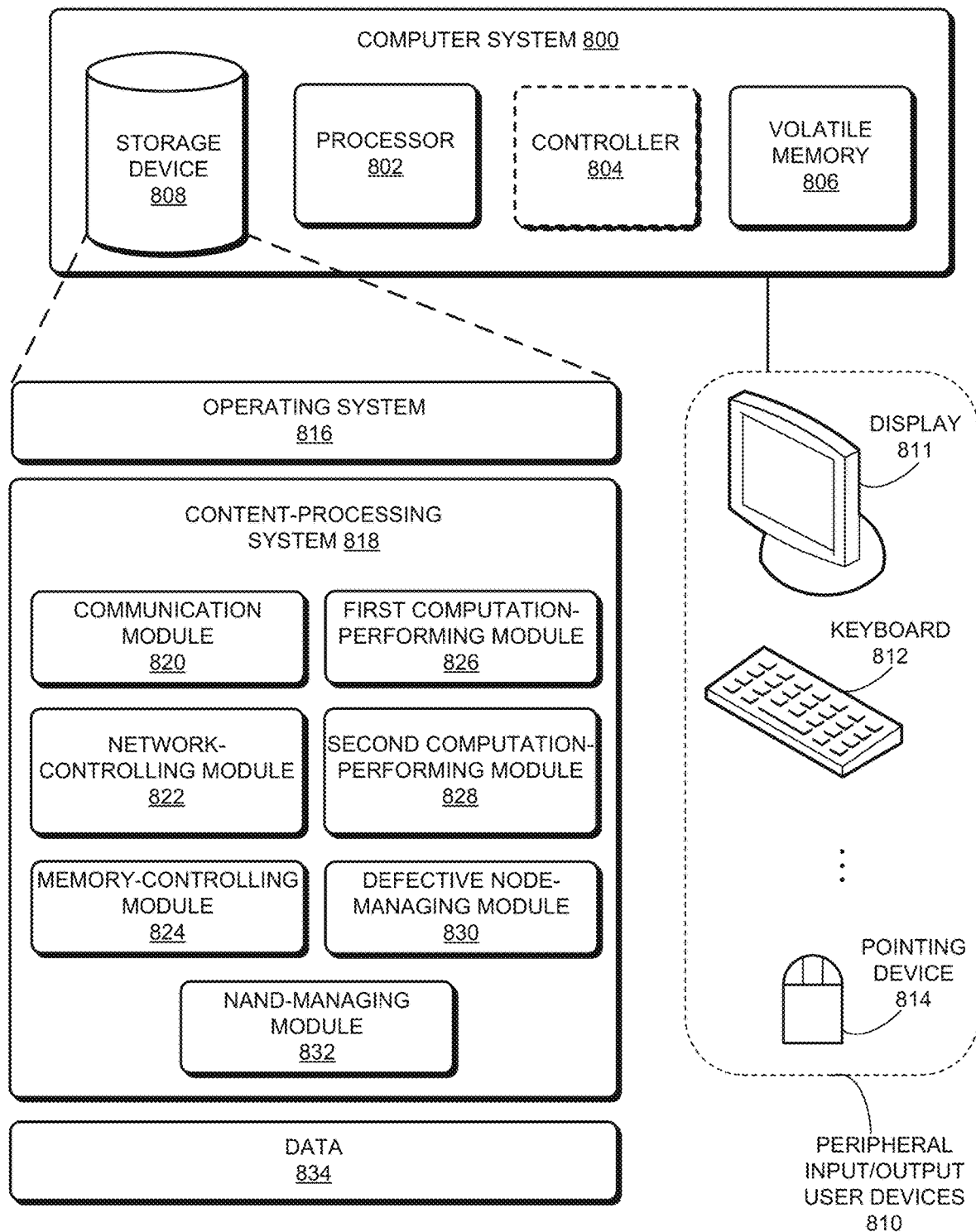
FIG. 8 illustrates an exemplary computer system that facilitates operation of a storage system, in accordance with an embodiment of the present application.

FIG. 8 illustrates an exemplary computer system 800 that facilitates operation of a storage system, in accordance with an embodiment of the present application. Computer system 800 includes a processor 802, a volatile memory 806, and a storage device 808. In some embodiments, computer system 800 can include a controller 804 (indicated by the dashed lines). Volatile memory 806 can include, e.g., random access memory (RAM), that serves as a managed memory, and can be used to store one or more memory pools. Storage device 808 can include persistent storage which can be managed or accessed via processor 802 (or controller 804). Furthermore, computer system 800 can be coupled to peripheral input/output (I/O) user devices 810, e.g., a display device 811, a keyboard 812, and a pointing device 814. Storage device 808 can store an operating system 816, a content-processing system 818, and data 836.

Content-processing system 818 can include instructions, which when executed by computer system 800, can cause computer system 800 or processor 802 to perform methods and/or processes described in this disclosure. Specifically, content-processing system 818 can include instructions for receiving and transmitting data packets, including data to be read or written and an input/output (I/O) request (e.g., a read request or a write request) (communication module 820).

Content-processing system 818 can further include instructions for receiving, by a network controller of a device, a request to write first data to a non-volatile memory of the device, wherein the device comprises: the network controller; a memory controller; a heterogeneous processor; a field-programmable gate array (FPGA); and a non-volatile-media controller (communication module 820 and network-controlling module 822). The memory controller comprises: a fabric controller component configured to communicate with the network controller, the heterogeneous processor, the FPGA, and the non-volatile-media controller; and a media controller component configured to manage access relating to data stored in a volatile memory media (memory-controlling module 824). Content-processing system 818 can include instructions for performing, by the heterogeneous processor, computation tasks relating to the first data and data stored via the memory controller (first computation-performing module 826). Content-processing system 818 can include instructions for performing, by the FPGA, computations relating to the first data and data stored via the non-volatile-media controller (second computation-performing module 828). Content-processing system 818 can include instructions for writing, by the non-volatile-media controller, the first data to a non-volatile media of the device (NAND-managing module 832).

Content-processing system 818 can include instructions for identifying a defective node of an immersed rack (defective node-managing module 830), where the rack is immersed with the plugged-in plurality of nodes into a liquid cooling tank. Content-processing system 818 can include instructions for removing the defective node without affecting operation of the rack or a remainder of the nodes in the rack, replacing or repairing the defective node to obtain a new node, and plugging the new node into the rack by immersing the new node into the liquid cooling tank in a location previously occupied by the defective node (actions which can be performed by a node-repairing module (not shown) or by a user or administrative agent.

Data 834 can include any data that is required as input or generated as output by the methods and/or processes described in this disclosure. Specifically, data 834 can store at least: data; a request; a read request; a write request; an input/output (I/O) request; data or metadata associated with a read request, a write request, or an I/O request; an indicator or identifier of a printed circuit board; an indicator or identifier of an interface or other component, circuit, IC, module, or unit on a printed circuit board; an indicator or identifier of a network controller, a processor, a heterogeneous processor, a storage FPGA, a memory controller, or a non-volatile memory controller; an indicator or identifier of a power module, a monitoring and operating module, and a network interface; an indicator or identifier of components of a network controller, including an SRAM or embedded DRAM, an Ethernet interface, at least one ARM core, a bus switch, and a bus root complex or an endpoint; a node or switch identifier; an indication or identifier of a defective node, a new node, or a rack; and any information or data related to, traveling through, stored in, or accessed from a printed circuit board or any component of a printed circuit board as described herein.

Figure 9:
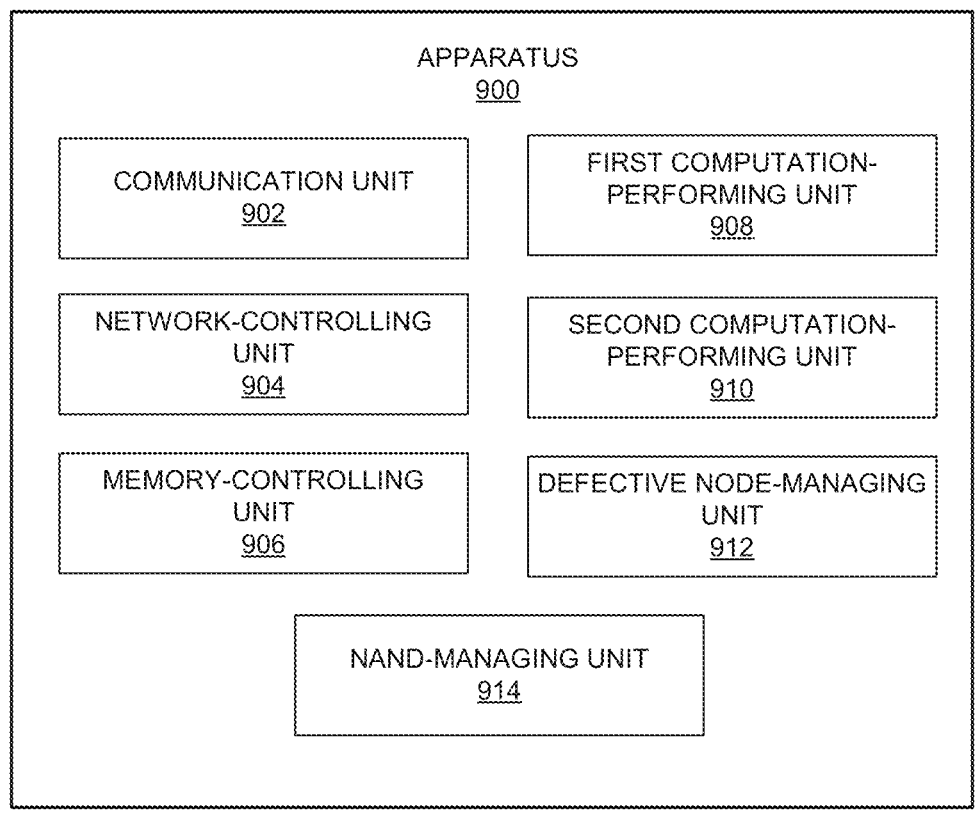
FIG. 9 illustrates an exemplary apparatus that facilitates operation of a storage system, in accordance with an embodiment of the present application.

FIG. 9 illustrates an exemplary apparatus 900 that facilitates operation of a storage system, in accordance with an embodiment of the present application. Apparatus 900 can comprise a plurality of units or apparatuses which may communicate with one another via a wired, wireless, quantum light, or electrical communication channel. Apparatus 900 may be realized using one or more integrated circuits, and may include fewer or more units or apparatuses than those shown in FIG. 9. Furthermore, apparatus 900 may be integrated in a computer system, or realized as a separate device or devices capable of communicating with other computer systems and/or devices.

Apparatus 900 can comprise modules or units 902-914 which are configured to perform functions or operations similar to modules 820-832 of computer system 800 of FIG. 8, including: a communication unit 902; a network-controlling unit 904; a memory-controlling unit 906; a first computation-performing unit 908; a second computation-performing unit 910; a defective node-managing unit 912; and a NAND-managing unit 914.

The data structures and code described in this detailed description are typically stored on a computer-readable storage medium, which may be any device or medium that can store code and/or data for use by a computer system. The computer-readable storage medium includes, but is not limited to, volatile memory, non-volatile memory, magnetic and optical storage devices such as disk drives, magnetic tape, CDs (compact discs), DVDs (digital versatile discs or digital video discs), or other media capable of storing computer-readable media now known or later developed.

The methods and processes described in the detailed description section can be embodied as code and/or data, which can be stored in a computer-readable storage medium as described above. When a computer system reads and executes the code and/or data stored on the computer-readable storage medium, the computer system performs the methods and processes embodied as data structures and code and stored within the computer-readable storage medium.

Furthermore, the methods and processes described above can be included in hardware modules. For example, the hardware modules can include, but are not limited to, application-specific integrated circuit (ASIC) chips, field-programmable gate arrays (FPGAs), and other programmable-logic devices now known or later developed. When the hardware modules are activated, the hardware modules perform the methods and processes included within the hardware modules.

The foregoing embodiments described herein have been presented for purposes of illustration and description only. They are not intended to be exhaustive or to limit the embodiments described herein to the forms disclosed. Accordingly, many modifications and variations will be apparent to practitioners skilled in the art. Additionally, the above disclosure is not intended to limit the embodiments described herein. The scope of the embodiments described herein is defined by the appended claims.

What is claimed is:

1. A printed circuit board (PCB), comprising:
   a network controller; a memory controller; a heterogeneous processor; a field-programmable gate array (FPGA); and a non-volatile-media controller,
   wherein the PCB does not include a central processing unit;
   wherein the memory controller comprises:
      a fabric controller component configured to communicate via a peer-to-peer direct memory access with the network controller, the heterogeneous processor, the FPGA, and the non-volatile-media controller;
      a media controller component configured to manage access relating to data stored in a volatile memory media,
   wherein the FPGA is configured to perform computations relating to data stored via the non-volatile-media controller, and
   wherein the heterogeneous processor is configured to perform computation tasks relating to data stored via the memory controller,
   wherein the PCB is one of a plurality of PCBs with no respective separate coverings which are each plugged into a rack and coupled to one of a plurality of switches in the rack,
   wherein the rack, including the plugged-in PCBs with no separate coverings and the switches, is immersed in a liquid cooling tank,
   wherein a defective plugged-in PCB with no separate covering of the immersed rack is removed without affecting operation of the rack or a remainder of the plugged-in PCBs in the rack, and
   wherein a new PCB is plugged into the rack by immersing the new PCB with no separate covering in the liquid cooling tank at a first location previously occupied by the defective plugged-in PCB.

2. The printed circuit board of claim 1,
   wherein the fabric controller is further configured to manage data received and transmitted via an internal bus protocol to communicate with the network controller, the heterogeneous processor, the FPGA, and the non-volatile-media controller.

3. The printed circuit board of claim 1, further comprising:
   a power module;
   a monitoring and operating module; and
   at least one network interface configured to receive data from another node or computing device and further configured to transmit data to the network controller.

4. The printed circuit board of claim 1, wherein the printed circuit board is immersed in a liquid cooling medium.

5. The printed circuit board of claim 1,
   wherein the network controller is an Ethernet controller,
   wherein the non-volatile-media controller is a NAND controller, and
   wherein the memory controller is a DRAM controller.

6. The printed circuit board of claim 1, wherein the network controller further comprises:
   at least one static random-access memory (SRAM) or embedded dynamic random-access memory (DRAM);
   an Ethernet interface;
   at least one ARM core;
   a bus switch; and
   a bus root complex or an endpoint.

7. The printed circuit board of claim 1,
wherein the printed circuit board comprises a node,
wherein the other plugged-in circuit boards comprise nodes, and
wherein each node is connected to one of the plurality of switches in the rack.

8. The printed circuit board of claim 7, wherein a switch is an Ethernet switch or an access switch.

9. The printed circuit board of claim 7,
wherein a defective node of the immersed rack is identified;
wherein the defective node is removed without affecting operation of the rack or a remainder of the nodes in the rack;
wherein the defective node is replaced or repaired to obtain a new node; and
wherein the new node is plugged into the rack by immersing the new node in the liquid cooling tank at a location previously occupied by the defective node.

10. A computer-implemented method, comprising:
receiving, by a network controller of a device, a request to write first data to a non-volatile memory of the device,
wherein the device comprises: the network controller; a memory controller; a heterogeneous processor; a field-programmable gate array (FPGA); and a non-volatile-media controller, and
wherein the memory controller comprises:
a fabric controller component configured to communicate via a peer-to-peer direct memory access with the network controller, the heterogeneous processor, the FPGA, and the non-volatile-media controller; and
a media controller component configured to manage access relating to data stored in a volatile memory media;
performing, by the heterogeneous processor, computation tasks relating to the first data and data stored via the memory controller;
performing, by the FPGA, computations relating to the first data and data stored via the non-volatile-media controller; and
writing, by the non-volatile-media controller, the first data to a non-volatile media of the device,
wherein the device comprises a printed circuit board (PCB) which is one of a plurality of printed circuit boards (PCBs) with no respective coverings which are each plugged into a rack and coupled to one of a plurality of switches in the rack, wherein the PCB does not include a central processing unit,
immersing the rack, including the plugged-in plurality of PCBs with no separate coverings and the switches, in a liquid cooling tank
removing a defective plugged-in PCB with no separate covering of the immersed rack without affecting operation of the rack or a remainder of the plugged-in PCBs in the rack; and
plugging a new PCB into the rack by immersing the new PCB with no separate covering in the liquid cooling tank at a first location previously occupied by the defective plugged-in PCB.

11. The method of claim 10,
wherein the fabric controller is further configured to manage data received and transmitted via an internal bus protocol to communicate with the network controller, the heterogeneous processor, the FPGA, and the non-volatile-media controller.

12. The method of claim 10, wherein the device further comprises:
a power module;
a monitoring and operating module; and
at least one network interface configured to receive data from another node or computing device and further configured to transmit data to the network controller.

13. The method of claim 10, wherein the device is immersed in a liquid cooling medium.

14. The method of claim 10,
wherein the network controller is an Ethernet controller,
wherein the non-volatile-media controller is a NAND controller, and
wherein the memory controller is a DRAM controller.

15. The method of claim 10, wherein the network controller further comprises:
at least one static random-access memory (SRAM) or embedded dynamic random-access memory (DRAM);
an Ethernet interface;
at least one ARM core;
a bus switch; and
a bus root complex or an endpoint.

16. The method of claim 10,
wherein the device is plugged into a rack with a plurality of other devices,
wherein the device comprises a node,
wherein the other plugged-in devices are printed circuit boards which comprise nodes, and
wherein each node is connected to one of a plurality of switches in the rack.

17. The method of claim 16, wherein a switch is an Ethernet switch or an access switch.

18. The method of claim 16, further comprising:
identifying a defective node of the immersed rack;
removing the defective node without affecting operation of the rack or a remainder of the nodes in the rack;
replacing or repairing the defective node to obtain a new node; and
plugging the new node into the rack by immersing the new node in the liquid cooling tank at a location previously occupied by the defective node.

19. A memory controller,
wherein the memory controller resides on a printed circuit board (PCB),
wherein a network controller, a heterogeneous processor, a field-programmable gate array (FPGA), and a non-volatile-media controller reside on the printed circuit board (PCB), wherein the PCB does not include a central processing unit,
wherein the memory controller comprises:
a fabric controller component configured to manage data received and transmitted via an internal bus protocol to communicate directly with the network controller, the heterogeneous processor, the FPGA, and the non-volatile-media controller; and
a media controller component configured to manage access relating to data stored in a volatile memory media,
wherein the FPGA is configured to perform computations relating to data stored via the non-volatile-media controller,
wherein the heterogeneous processor is configured to perform computation tasks relating to data stored via the memory controller,
wherein the PCB is configured to be plugged in to a rack with a plurality of other plugged-in circuit boards, wherein each of the plugged-in PCBs has no separate covering and is coupled to one of a plurality of switches in the rack, wherein the rack, including the plugged-in PCBs with no separate coverings and the switches, is immersed in a liquid cooling tank, wherein a defective plugged-in PCB with no separate covering of the immersed rack is removed without affecting operation of the rack or a remainder of the plugged-in PCBs in the rack, and wherein a new PCB is plugged into the rack by immersing the new PCB with no separate covering in the liquid cooling tank at a first location previously occupied by the defective plugged-in PCB.

20. The memory controller of claim 19, wherein the printed circuit board comprises a node, wherein the other plugged-in circuit boards comprise nodes, wherein each node is connected to one of a plurality of switches in the rack, wherein the rack is immersed with the plugged-in plurality of nodes into a liquid cooling tank, wherein a defective node of the immersed rack is identified, wherein the defective node is removed without affecting operation of the rack or a remainder of the nodes in the rack, wherein the defective node is replaced or repaired to obtain a new node, and wherein the new node is plugged into the rack by immersing the new node into the liquid cooling tank in a location previously occupied by the defective node.

* * * * *